(12) United States Patent
Hidaka

(10) Patent No.: US 6,885,216 B2
(45) Date of Patent: Apr. 26, 2005

(54) SEMICONDUCTOR CIRCUIT DEVICE HAVING ACTIVE AND STANDBY STATES

(75) Inventor: Hideto Hidaka, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 10 days.

(21) Appl. No.: 10/254,775

(22) Filed: Sep. 26, 2002

(65) Prior Publication Data

US 2003/0090292 A1 May 15, 2003

Related U.S. Application Data

(62) Division of application No. 09/167,985, filed on Oct. 8, 1998, now Pat. No. 6,459,301.

(30) Foreign Application Priority Data

May 14, 1998 (JP) .......................................... 10-132227

(51) Int. Cl.[7] .......................................... H03K 19/003
(52) U.S. Cl. .............................. 326/33; 326/17; 326/112
(58) Field of Search ............................ 326/17, 33, 112, 326/119, 121

(56) References Cited

U.S. PATENT DOCUMENTS

| | | | |
|---|---|---|---|
| 5,101,119 A | 3/1992 | Yoshimori et al. | |
| 5,115,150 A | 5/1992 | Ludwig | |
| 5,278,460 A | 1/1994 | Casper | |
| 5,486,774 A | * 1/1996 | Douseki et al. | 326/33 |
| 5,594,371 A | 1/1997 | Douseki | |
| 5,614,847 A | * 3/1997 | Kawahara et al. | 326/98 |
| 5,652,730 A | 7/1997 | Kono et al. | |
| 5,973,533 A | 10/1999 | Nagaoka | |
| 5,999,017 A | 12/1999 | Irwin | |
| 6,288,586 B1 | 9/2001 | Ahn et al. | |

FOREIGN PATENT DOCUMENTS

| | | |
|---|---|---|
| JP | 4-134923 | 5/1992 |
| JP | 6-237164 | 8/1994 |
| JP | 9-97495 | 4/1997 |

OTHER PUBLICATIONS

"Ultra LSI Memory", Kiyoo Ito, Advanced Electronics Series, I–9, BAIFUKAN, Nov. 5, 1994, pp. 365–368.

* cited by examiner

*Primary Examiner*—Anh Q. Tran
(74) *Attorney, Agent, or Firm*—McDermott Will & Emery LLP

(57) ABSTRACT

A P channel MOS transistor and an N channel MOS transistor turned on/off in response to an input signal in an active state as well as an N channel MOS transistor connected between an output node and the N channel MOS transistor and turned on/off in response to a control signal are provided. The input signal is at the L level in a standby state. The control signal is at the L level in the standby state and at the H level in the active state. This suppresses the effect of hot carriers in the active state and decreases a subthreshold current in the standby state.

5 Claims, 22 Drawing Sheets

F I G. 1
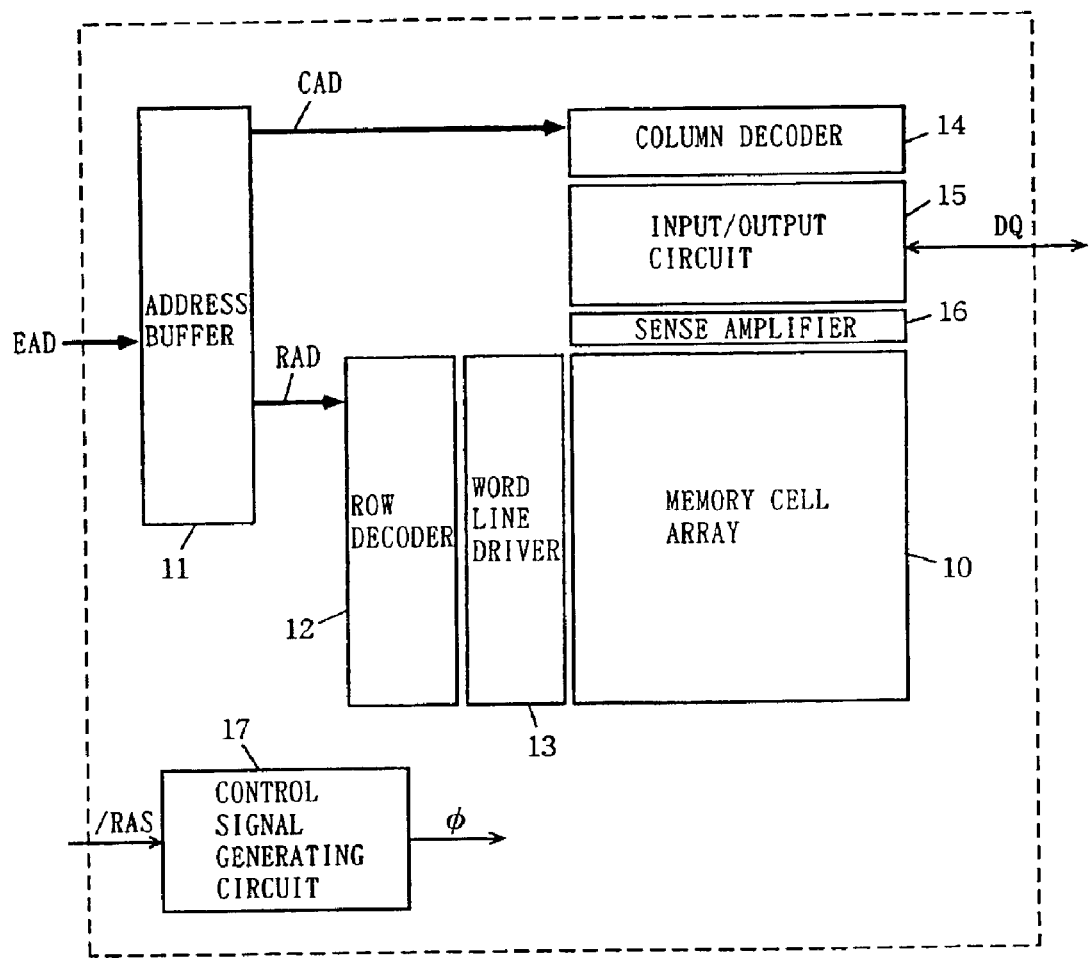

FIG. 2
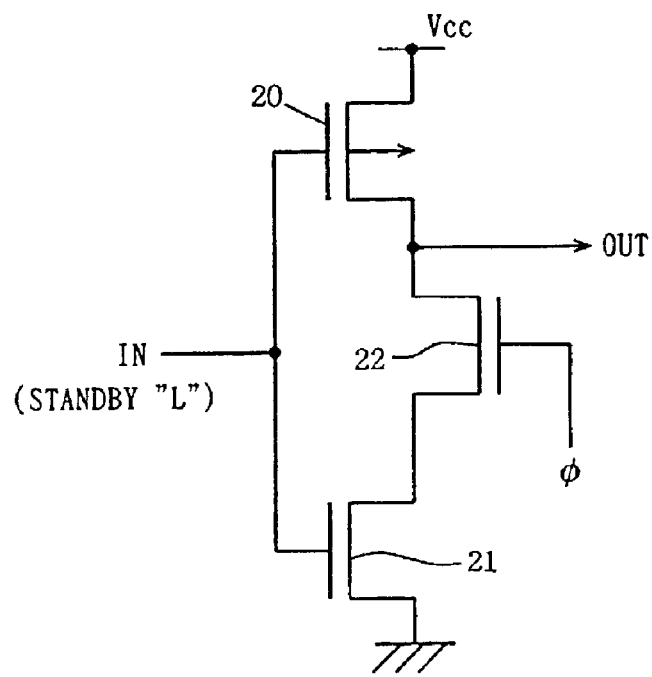
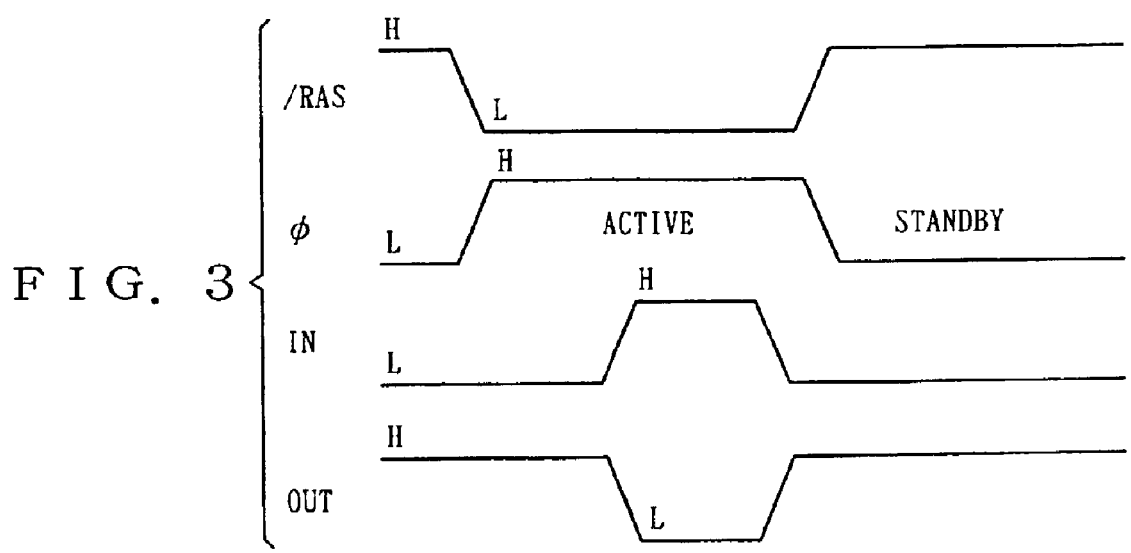
FIG. 3

SEMICONDUCTOR CIRCUIT DEVICE HAVING ACTIVE AND STANDBY STATES

This application is a division of application Ser. No. 09/167,985 filed Oct. 8, 1998, now U.S. Pat. No. 6,459,301.

BACKGROUND OF THE INVENTION

1. Field of the Invention

The present invention relates to semiconductor circuit devices and more specifically to a semiconductor circuit device having active and standby states.

2. Description of the Background Art

Prior Art 1

In miniaturizing transistors, power supply voltage is not always scaled down in accordance with the scale-down of a device but power supply voltage may remain constant when a device size is reduced. In this case, electric field strength in the vicinity of a drain increases. Accordingly, hot carriers are generated in a channel and injected into a gate oxide film, thereby deteriorating the characteristics of a transistor element. One method of solving this problem is called NOEMI (Normally-On Enhancement MOSFET Insertion). FIG. 40 shows one example of NOEMI. In this example, an N channel MOS transistor Qn2 is provided between the drain terminal of an N channel MOS transistor Qn1 and the output node of an inverter formed of a P channel MOS transistor Qp1 and N channel MOS transistor Qn1. Since the voltage of Vcc is always applied to the gate of N channel MOS transistor Qn2, N channel MOS transistor Qn2 is always in the on state By thus providing N channel MOS transistor Qn2, the drain voltage of N channel MOS transistor Qn1 is limited to (gate voltage of N channel MOS transistor Qn2)–(threshold of N channel MOS transistor Qn2).

In a CMOS type semiconductor device, in accordance with miniaturization of a device, power supply voltage is decreased so as to ensure the reliability of the device and reduce power consumption. In order to achieve high speed operation in this situation, the threshold of each MOS transistor needs to be lowered in accordance with the decreased power supply voltage. In this case, a subthreshold current flowing between a source and a drain when a transistor is in the off state increases. This increases a direct current in the entire large scale integration and especially increases a standby current in a dynamic semiconductor memory device. One method of solving this problem is the MT-CMOS (Multi-Threshold CMOS) configuration. One example of the MT-CMOS configuration will be described with reference to FIG. 41. An N channel MOS transistor Qn11 having a threshold (Mid-Vth) higher than that of a transistor in a CMOS inverter C1 is provided in series with inverter C1 operating at a low threshold. By controlling a control signal $\phi$ so that N channel MOS transistor Qn11 is turned on in an active state and turned off in a standby state, inverter C1 operates at high speed in the active state and the subthreshold current is decreased in the standby state.

Prior Art 2

One method capable of achieving the same effect as the MT-CMOS is to decrease a subthreshold current by causing the gate potential of N channel MOS transistor Qn11 shown in FIG. 41 to be a minus potential in the standby state.

Prior Art 3

In typical memory LSIs and logic LSIs, most node voltages are often predetermined in the standby state. As described in Very Large Scale Integration Memory, (1994), Baifukan S1, p. 365, there is a method to decrease a subthreshold current in the standby state by a logic circuit having a hierarchical configuration of power supplies. FIG. 42 is a block diagram showing one example of the logic circuit structure. The logic circuit includes an inverter IVL connected between a main power supply line MVcc and a sub ground line subGND and receiving an L level input signal in the standby state, an inverter IVH connected between a sub power supply line subVcc and a main ground line MGND and receiving an H level input signal in the standby state, a P channel MOS transistor Qp21 connected between main power supply line MVcc and sub power supply line subVcc and turned on/off in response to a control signal /$\phi$, and an N channel MOS transistor Qn21 connected between main ground line MGND and sub ground line subGND and turned on/off in response to a control signal $\phi$. Control signal $\phi$ is at the L level in the standby state and at the H level in the active state.

The thus structured logic circuit has its P channel MOS transistor Qp21 and N channel MOS transistor Qn21 turned off in the standby state. Accordingly, a subthreshold current flowing between the output node of inverter IVL and sub ground line subGND and a subthrreshold current flowing between the output node of inverter IVH and sub power supply line subVcc are decreased. In the active state, Qp21 and Qn21 are on and the logic circuit performs a normal operation.

Prior Art 4

As the operating voltage and threshold voltage of a transistor decrease, it comes to be difficult to ignore a subthreshold current in the active state as well. Especially in a circuit block in which a large number of the same circuits are repeated as in driving circuits of word drivers, decoders and sense amplifiers and a small number of them are selected to operate, a subthreshold current continues to flow in a large number of non-selected circuits. A method to solve this problem is described in Very Large Scale Integration Memory, (1994), Baifukan, p. 367. FIG. 43 is a block diagram showing one example of the method. According to the method, a circuit is divided into a plurality of blocks BKi (i=1–n), and switch transistors PSWi are provided between sub power supply lines subVcci for respective blocks BKi and main power supply line MVcc. Only switch transistor PSWm corresponding to a selected block BKm is turned on and other switch transistors PSWi are turned off to decrease a subthreshold current flowing in non-selected blocks.

Problem with Prior Art 1

In the circuit of the NOEMI configuration, N channel MOS transistor Qn2 is always in the on state as shown in FIG. 40. When the threshold of N channel MOS transistor Qn1 is decreased, the subthreshold current flowing between output node OUT and ground node GND in the standby state thus increases.

Problem with Prior Art 2

In practice, the subtrheshold current is substantially varied by variation in the threshold of a transistor caused when manufactured. Since the level of the minus voltage applied to the gate of N channel MOS transistor Qn11 is constant, the variation in the transistor threshold prevents the subthreshold current from efficiently being decreased, lowers the operating speed of the circuit even when the subthreshold current can be decreased, and so on.

Problem with Prior Art 3

In the circuit having hierarchical power supply lines and ground lines, the capacitance of the sub power supply line and the sub ground line increases. As a result, the sub power supply line and the sub ground line do not always have a power supply potential or a ground potential immediately after a power supply is turned on or immediately after a transition from the standby state to the active state. Accordingly, there caused problems such as a malfunction due to a timing mismatch and consumption of a peak current.

Problem with Prior Art 4

The circuit structure as shown in FIG. 43 requires substantial time from block selection to sufficient precharging of a sub power supply line in the block. The internal circuit in a selected block may operate even when its sub power supply line is not sufficiently precharged. Accordingly, there caused problems such as an access time delay and a malfunction.

SUMMARY OF THE INVENTION

An object of the present invention is to provide a semiconductor circuit device suppressing the effect of hot carriers in an active state and decreasing a subthreshold current in a standby state.

Another object of the present invention is to provide a semiconductor circuit device decreasing a subthreshold current regardless of variation in a transistor threshold.

Still another object of the present invention is to provide a semiconductor circuit device properly operating even immediately after a power supply is turned on or immediately after a transition from a standby state to an active state.

Yet another object of the present invention is to provide a semiconductor circuit device in which an internal circuit in a block properly operates immediately after the block is selected.

A semiconductor circuit device according to one aspect of the present invention has active and standby states and includes a logic circuit. The logic circuit includes an output node and first to third transistors. The first transistor is connected between the output node and a first power supply node, turned on/off in response to an input signal in the active state, and turned off in the standby state. The second transistor is connected between the output node and a second power supply node, and turned on/off complementarily to the first transistor in response to the input signal in the active state. The third transistor is connected between the output node and the first transistor, turned at least on when the first transistor is turned on in the active state, and turned off in the standby state.

In the semiconductor circuit device, the third transistor is turned at least on when the first transistor is turned on in the active state. Accordingly, the logic circuit operates in a similar manner to the case when the third transistor is not provided. Since the drain voltage of the first transistor is limited to (gate voltage of the first transistor)–(threshold of the first transistor), the effect of hot carriers can be suppressed. Meanwhile, the first and third transistors are off in the standby state. Therefore, a subthreshold current flowing between the output node and the first power supply node is decreased.

Preferably, at least one of the first and third transistors has a threshold higher than the threshold of the second transistor. In the semiconductor circuit device, therefore, the subthreshold current flowing between the output node and the first power supply node can further be decreased.

Preferably, the input signal is supplied to the gate of the third transistor.

In the semiconductor circuit device, the third transistor is turned at least on when the first transistor is turned on in response to the input signal in the active state, and turned off in the standby state. Accordingly, means for controlling on/off of the third transistor does not need to be provided separately.

A semiconductor circuit device according another aspect of the present invention has active and standby states, and includes a control signal generating circuit, an adjusting circuit and a logic circuit. The control signal generating circuit generates a control signal that is at a logic high level in the active state and at a level lower than a logic low level in the standby state. The adjusting circuit adjusts the low level of the control signal at a desired level. The logic circuit includes an output node, a first N channel MOS transistor, a P channel MOS transistor and a second N channel MOS transistor. The first N channel MOS transistor is connected between the output node and a ground node, turned on/off in response to an input signal in the active state, and turned off in the standby state. P channel MOS transistor is connected between the output node and a power supply node, turned on/off in response to the input signal in the active state, and turned on in the standby state. The second N channel MOS transistor is connected in series with the first N channel MOS transistor between the output node and the ground node, turned on in response to the control signal in the active state, and turned off in the standby state.

In the semiconductor circuit device, the first and second N channel MOS transistors are turned off in the standby state. At this time, the second N channel MOS transistor is turned strongly off in response to the control signal having a level lower than the logic low level. Accordingly, a subthreshold current flowing between the output node and the ground node is decreased. Further, the low level of the control signal received by the second N channel MOS transistor is adjusted at a desired level by the adjusting circuit. Accordingly, the subthreshold current flowing between the output node and the ground node can more efficiently be decreased.

A semiconductor circuit device according to still another aspect of the present invention has active and standby states, and includes a control signal generating circuit, an adjusting circuit and a logic circuit. The control signal generating circuit generates a control signal that is at a logic low level in the active state and at a level higher than a logic high level in the standby state. The adjusting circuit adjusts the high level of the control signal at a desired level. The logic circuit includes an output node, a first P channel MOS transistor, an N channel MOS transistor and a second P channel MOS transistor. The first P channel MOS transistor is connected between the output node and a power supply node, turned on/off in response to an input signal in the active state, and turned off in the standby state. The N channel MOS transistor is connected between the output node and a ground node, turned on/off in response to the input signal in the active state, and turned on in the standby state. The second P channel MOS transistor is connected in series with the first P channel MOS transistor between the output node and the power supply node, turned on in response to the control signal in the active state, and turned off in the standby state.

In the semiconductor circuit device, the first and second P channel MOS transistors are turned off in the standby state. At this time, the second P channel MOS transistor is turned strongly off in response to the control signal having a level higher than the logic high level. Accordingly, a subthreshold current flowing between the output node and the power supply node is decreased. Further, the high level of the control signal received by the second P channel MOS transistor is adjusted at a desired level by the adjusting circuit. Accordingly, the subthreshold current flowing between the output node and the power supply node can more efficiently be decreased.

Preferably, the adjusting circuit includes a charge pump circuit and a detecting circuit. The detecting circuit has an adjustable detecting level. The detecting circuit compares the output voltage of the charge pump circuit with the detecting level, activates the charge pump circuit when the output voltage has not reached the detecting level, and inactivates the charge pump circuit when the output voltage has reached the detecting level.

In the semiconductor circuit device, the output voltage of the charge pump circuit is made equal to the detecting level set at a desired value. Accordingly, the level of the control signal in the standby state can be adjusted at a desired value and the value can be kept constant.

A semiconductor circuit device according to yet another aspect of the present invention has active and standby states, and includes a main power supply line, a sub power supply line, a first adjusting circuit, a main ground line, a sub ground line, a second adjusting circuit, a plurality of first logic circuits and a plurality of second logic circuits. The first adjusting circuit receives a power supply voltage from the main power supply line, supplies the sub power supply line with the power supply voltage in the active state, and supplies the sub power supply line with an adjustable voltage lower than the power supply voltage in the standby state. The second adjusting circuit receives a ground voltage from the main ground line, supplies the sub ground line with the ground voltage in the active state, and supplies the sub ground line with an adjustable voltage higher than the ground voltage in the standby state. The plurality of first logic circuits each have a power supply node connected to the main power supply line and a ground node connected to the sub ground line and output a logic high level signal in the standby state. The second logic circuits each have a power supply node connected to the sub power supply line and a ground node connected to the main ground line and output a logic low level signal in the standby state.

In the semiconductor circuit device, the sub power supply line has a voltage lower than the power supply voltage and the sub ground line has a voltage higher than the ground voltage in the standby state. Accordingly, a subthreshold current flowing between the output nodes of the plurality of first logic circuits and the sub ground line as well as between the output nodes of the plurality of second logic circuits and the sub power supply line is decreased. The voltage levels of the sub power supply line and sub ground line at this time are adjusted at desired values by the first and second adjusting circuits, respectively. Accordingly, the subthreshold current can more efficiently be decreased.

A semiconductor circuit device according to yet another aspect of the present invention has active and standby states, and includes a main power supply line, a sub power supply line, a first switching element, a main ground line, a sub ground line, a second switching element, a plurality of first logic circuits and a plurality of second logic circuits. The first switching element is connected between the main power supply line and the sub power supply line, turned on when a power supply is turned on and in the active state, and turned off in the standby state. The second switching element is connected between the main ground line and the sub ground line, turned on when a power supply is turned on and in the active state, and turned off in the standby state. The plurality of first logic circuits each have a power supply node connected to the main power supply line and a ground node connected to the sub ground line and output a logic high level signal in the standby state. The plurality of the second logic circuits each have a power supply node connected to the sub power supply line and a ground node connected to the main ground line and output a logic low level signal in the standby state.

In the semiconductor circuit device, when a power supply is turned on and in the active state, the first and second switching elements are turned on and the sub power supply line and the sub ground line are precharged to power supply and ground potentials, respectively.

Preferably, the semiconductor circuit device further includes a latch circuit and a logic controlling circuit. The logic controlling circuit passes the output signal of the latch circuit in the active state and supplies the logic circuit with a signal, as an input signal, for turning off the first transistor regardless of the output signal of the latch circuit in the standby state.

In the semiconductor circuit device, the first transistor included in the logic circuit is turned on/off in response to the output signal of the latch circuit in the active state and turned off in the standby state. Accordingly, there is no need to consider the level of the input signal to the logic circuit in the standby state.

A semiconductor circuit device according to yet another aspect of the present invention includes a main power supply line, n blocks, a block selecting circuit, n switching elements and a controlling circuit. The n blocks each have a sub power supply line and an internal circuit connected to the sub power supply line. The block selecting circuit selectively activates the n blocks. The n switching elements are each connected between the main power supply line and the sub power supply line in a corresponding block. The controlling circuit turns on each of the m switching elements, of the n switching elements, which include a switching element corresponding to a block to be activated by the block selecting circuit and thereafter turns off a switching element corresponding to a block other than the block to be activated by the block selecting circuit. Preferably, m is n or less.

In the semiconductor circuit device, each of the m switching elements which include a switching element corresponding to a block to be activated by the block selecting circuit is turned on, and all sub power supply lines included in the blocks corresponding to the m switching elements are precharged to the power supply voltage. Thereafter, a switching element corresponding to a block other than the block to be activated by the block selecting circuit are turned off. As a result, when a block to be activated by the block selecting circuit is activated, the sub power supply line in the block has sufficiently be precharged Accordingly, the internal circuit in the block will not cause a malfunction.

A semiconductor circuit device according to yet another aspect of the present invention includes a main power supply line, n blocks, a block selecting circuit, n first switching elements, a first controlling circuit, n second switching elements and a second controlling circuit. The n blocks each have a sub power supply line and an internal circuit connected to the sub power supply line. The block selecting circuit selectively activates the n blocks. The n first switching elements are each connected between the main power supply line and the sub power supply line in a corresponding block. The first controlling circuit turns on a first switching element corresponding to a block to be activated by the block selecting circuit. The n second switching elements are each connected in parallel with a corresponding first switching element. Before the block selecting circuit activates a block, the second controlling circuit turns on each one of the m second switching elements, of the n second switching elements, which include a second switching element corresponding to a block to be activated by the block selecting circuit. Preferably, m is n or less.

In the semiconductor circuit device, each one of the m second switching elements, of the n second switching elements, which include a second switching element corresponding to a block to be activated by the block selecting circuit is turned on before the block selecting circuit activates a block, and all sub power supply lines included in blocks corresponding to the m second switching elements are precharged to the power supply voltage. Thereafter, a first switching element corresponding to a block to be activated by the block selecting circuit is turned on. As a result, when a block to be activated by the block selecting circuit is activated, the sub power supply line in the block has sufficiently be precharged. Accordingly, an internal circuit in the block will not cause a malfunction.

A semiconductor circuit device according to still another aspect of the present invention includes a main power supply line, a plurality of blocks, a block selecting circuit, a plurality of switching elements and a controlling circuit. The plurality of blocks each have a sub power supply line and an internal circuit connected to the sub power supply line. The block selecting circuit selectively activates the plurality of blocks. The plurality of switching elements are provided corresponding to the plurality of blocks and each connected between the main power supply line and a corresponding block. The controlling circuit successively turns on the plurality of switching elements before the block selecting circuit activates a block.

In the semiconductor circuit device, a plurality of switching elements are successively turned on and the sub power supply lines included in corresponding blocks are precharged to the power supply potential before the block selecting circuit activates a block. Accordingly, the sub power supply lines in all blocks can be precharged without causing a peak current that is produced when the sub power supply lines in all blocks are precharged simultaneously.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a block diagram showing the overall structure of a DRAM according to a first embodiment of the present invention.

FIG. 2 is a circuit diagram showing the structure of an inverter receiving an L level input signal in a standby state in the DRAM shown in FIG. 1.

FIG. 3 is a timing chart for describing the operation of the inverter shown in FIG. 2.

DESCRIPTION OF THE PREFERRED EMBODIMENTS

Figure 4:
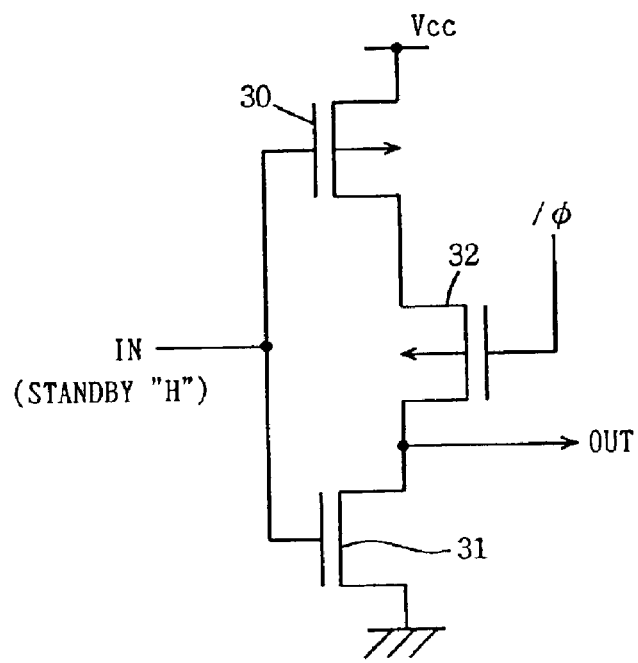
FIG. 4 is a circuit diagram showing the structure of an inverter included in the DRAM shown in FIG. 1 and receiving an H level input signal in a standby state.

The embodiments of the present invention will be described below in detail with reference to the drawings. The same or corresponding parts throughout the drawings have the same reference characters and their description will not be repeated.

First Embodiment

FIG. 1 is a block diagram showing the overall structure of a DRAM according to a first embodiment of the present invention. Referring to FIG. 1, the DRAM includes a memory cell array 10, an address buffer 11, a row decoder 12, a word line driver 13, a column decoder 14, an input/output circuit 15, a sense amplifier 16 and a control signal generating circuit 17.

Memory cell array 10 includes a plurality of memory cells (not shown) arranged in rows and columns, a plurality of word lines (not shown) arranged in rows, and a plurality of bit line pairs (not shown) arranged in columns. Address buffer 11 supplies row decoder 12 with an external address signal EAD as a row address signal RAD in response to a row address strobe signal /RAS, and supplies column decoder 14 with an external address signal EAD as a column address signal CAD in response to a column address strobe signal. Row decoder 12 selects a row (word line) in memory cell array 10 in response to row address signal RAD from address buffer 11. Word line driver 13 boosts the selected word line to a potential higher than a power supply voltage. Column decoder 14 selects a column (bit line pair) in memory cell array 10 in response to column address signal CAD from address buffer 11. Input/output circuit 15 reads data from a memory cell (not shown) in memory cell array 10, outputs it as a data signal DQ, and writes an external data signal DQ to a memory cell (not shown) in memory cell array 10. Sense amplifier 16 amplifies a data signal read from a memory cell (not shown) in memory cell array 10. Control signal generating circuit 17 generates a control signal φ in response to row address strobe signal /RAS.

FIG. 2 is a circuit diagram showing the structure of an inverter included in the DRAM shown in FIG. 1 and receiving an L level input signal in a standby state. Referring to FIG. 2, the inverter is a typical inverter formed of a P channel MOS transistor 20 and an N channel MOS transistor 21, further provided with an N channel MOS transistor 22. P channel MOS transistor 20 has a low level threshold, and it is connected between a power supply node Vcc and an output node OUT and turned on/off in response to an input signal IN. N channel MOS transistor 21 has a low level threshold, and it is connected between N channel MOS transistor 22 and a ground node GND and turned on/off in response to input signal IN. N channel MOS transistor 22 has an intermediate level threshold, and it is connected between output node OUT and N channel MOS transistor 21 and turned on/off in response to control signal φ. Control signal φ is at an L level when the inverter is in a standby state and at an H level when it is in an active state.

The operation of the thus structured inverter will be described below with reference to FIG. 3.

When row address strobe signal /RAS is at the H level, the inverter is in the standby state. At this time, the gates of P channel MOS transistor 20 and N channel MOS transistor 21 are supplied with L level input signal IN, and P channel MOS transistor 20 and N channel MOS transistor 21 are turned on and off, respectively. The gate of N channel MOS transistor 22 is supplied with L level control signal φ, and N channel MOS transistor 22 is turned off. Accordingly, a subthreshold current flowing between output node OUT and ground node GND is decreased as compared with the case in which N channel MOS transistor 22 is not provided.

When row address strobe signal /RAS is at the L level, the inverter is in the active state. At this time, the gate of N channel MOS transistor 22 is supplied with H level control signal φ, and N channel MOS transistor 22 is turned on. P channel MOS transistor 20 and N channel MOS transistor 21 operates in a similar manner to a typical inverter. Further, the drain voltage of N channel MOS transistor 21 is limited to (gate voltage of N channel MOS transistor 22)−(threshold of N channel MOS transistor) Accordingly, the effect of hot carriers caused when a high electric field is applied to the drain of N channel MOS transistor 21 can be suppressed.

According to the first embodiment, N channel MOS transistor 22 is provided between output node OUT and N channel MOS transistor 21, and N channel MOS transistor 22 that has an intermediate level threshold is turned off in the standby state and turned on in the active state. Accordingly, the effect of hot carriers is suppressed, and the subthreshold current flowing between output node OUT and ground node GND in the standby state is decreased.

Although P channel MOS transistor 20 and N channel MOS transistor 21 have a low level threshold and N channel MOS transistor 22 has an intermediate level threshold in this embodiment, P channel MOS transistor 20 and N channel MOS transistor 22 may have a low level threshold and N channel MOS transistor 21 may have an intermediate level threshold. Further, the thresholds of all transistors may be at an intermediate level or a low level.

The power supply voltage may be an external power supply voltage, a voltage higher than the power supply voltage, or an internal power supply voltage lower than the external power supply voltage.

Although the present invention is applied to the inverter formed of P channel MOS transistor 20 and N channel MOS transistor 21 in this embodiment, the present invention can also be applied to a logic circuit receiving an L level input signal in the standby state, such as an NAND circuit and an NOR circuit.

Second Embodiment

FIG. 4 is a circuit diagram showing the structure of an inverter included in the DRAM shown in FIG. 1 and receiving an H level input signal in a standby state. Referring to FIG. 4, the inverter is a typical inverter formed of a P channel MOS transistor 30 and an N channel MOS transistor 31, further provided with a P channel MOS transistor 32. P channel MOS transistor 30 has a low level threshold, and it is connected between power supply node Vcc and P channel MOS transistor 32 and turned on/off in response to input signal IN. N channel MOS transistor 31 has a low level threshold, and it is connected between an output node OUT and ground node GND and turned on/off in response to input signal IN. P channel MOS transistor 32 has an intermediate level threshold, and it is connected between P channel MOS transistor 30 and output ndoe OUT and turned on/off in response to a control signal /φ. Control signal /φ is at the H level when the inverter is in the standby state and at the L level when it is in the active state.

Figure 5:
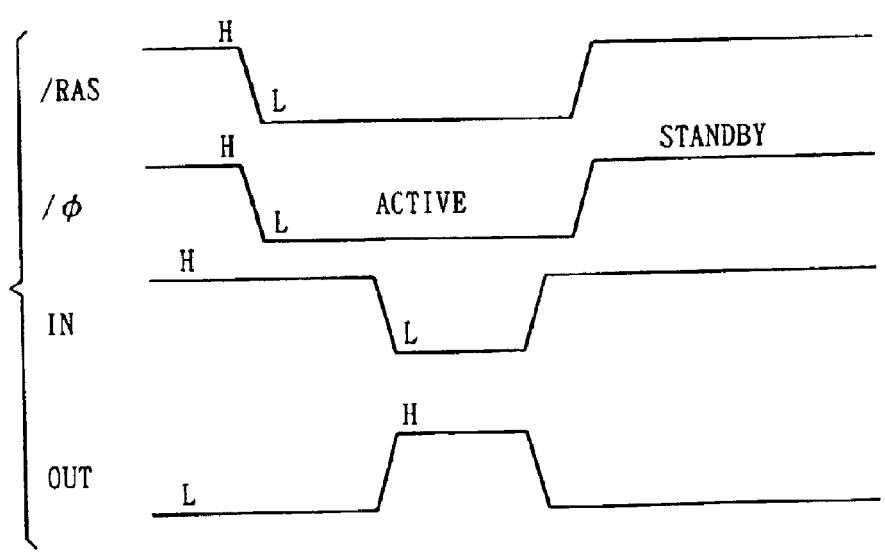
FIG. 5 is a timing chart for describing the operation of the inverter shown in FIG. 4.

The operation of the thus structured inverter will be described below with reference to FIG. 5.

When row address strobe signal /RAS is at the H level, the inverter is in the standby state. At this time, the gates of P channel MOS transistor 30 and N channel MOS transistor 31 are supplied with H level input signal IN, and P channel MOS transistor 30 and N channel MOS transistor 31 are turned off and on, respectively. The gate of P channel MOS transistor 32 is supplied with H level control signal /φ, and P channel MOS transistor 32 is turned off. Accordingly, a subthreshold current flowing between output node OUT and power supply node Vcc is decreased as compared with the case in which P channel MOS transistor 32 is not provided.

When row address strobe signal /RAS is at the L level, the inverter is in the active state. At this time, the gate of P channel MOS transistor 32 is supplied with L level control signal /φ, and P channel MOS transistor 32 is turned on. Thus, P channel MOS transistor 30 and N channel MOS transistor 31 operate in a similar manner to a typical inverter. Further, the drain voltage of P channel MOS transistor 30 is decreased to (gate voltage of P channel MOS transistor 32)+(threshold of P channel MOS transistor). Accordingly, the effect of hot carriers caused when a high electric field is applied to the drain of P channel MOS transistor 30 can be suppressed.

According to the second embodiment, P channel MOS transistor 32 is provided between output node OUT and P channel MOS transistor 30, and P channel MOS transistor 32 that has an intermediate level threshold is turned off in the standby state and turned on in the active state. Accordingly, the effect of hot carriers is suppressed, and the subthreshold current flowing between output node OUT and power supply node Vcc in the standby state is decreased.

Although P channel MOS transistor 30 and N channel MOS transistor 31 have a low level threshold and P channel MOS transistor 32 has an intermediate level threshold in this embodiment, P channel MOS transistor 32 and N channel MOS transistor 31 may have a low level threshold and P channel MOS transistor 30 may have an intermediate threshold. Further, the thresholds of all transistors may be at an intermediate level or a low level.

The power supply voltage may be an external power supply voltage, a voltage higher than the power supply voltage, or an internal power supply voltage lower than the external power supply voltage.

Although the present invention is applied to the inverter formed of P channel MOS transistor 30 and N channel MOS transistor 31 in this embodiment, the present invention can also be applied to a logic circuit receiving an H level input signal in the standby state, such as an NAND circuit and an NOR circuit.

Third Embodiment

Figure 6:
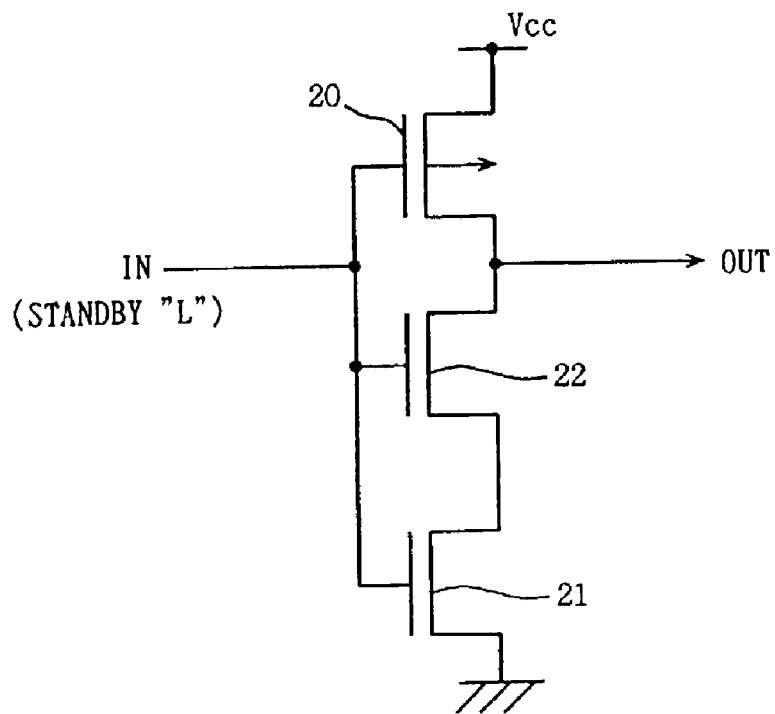
FIG. 6 is a circuit diagram showing the structure of an inverter according to a third embodiment of the present invention.

FIG. 6 is a circuit diagram showing the structure of an inverter in which the gate of N channel MOS transistor 22 is supplied with internal signal IN instead of control signal φ shown in FIG. 2. In the standby state, internal signal IN is at the L level and thus N channel MOS transistors 21 and 22 are off. Accordingly a subthreshold current flowing between output node OUT and ground node GND is decreased.

Meanwhile, in the active state, N channel MOS transistor 22 is turned on/off similarly to N channel MOS transistor 21. Thus, the circuit operates as a typical inverter. The effect of hot carriers caused when a high electric field is applied to the drain of N channel MOS transistor 21 can also be suppressed.

In the third embodiment, input signal IN is applied to the gate of N channel MOS transistor 22. Without providing control signal generating circuit 17 for generating control signal φ, therefore, the effect of hot carriers can be suppressed and the subthreshold current flowing between output node OUT and ground node GND in the standby state can be decreased.

Although P channel MOS transistor 20 and N channel MOS transistor 21 have a low level threshold and N channel MOS transistor 22 has an intermediate level threshold in this embodiment, P channel MOS transistor 20 and N channel MOS transistor 22 may have a low level threshold and N channel MOS transistor 21 may have an intermediate level threshold. Further, the thresholds of all transistors may be at an intermediate level or a low level.

The power supply voltage may be an external power supply voltage, a voltage higher than the power supply voltage, or an internal power supply voltage lower than the external power supply voltage.

Although the present invention is applied to the inverter formed of P channel MOS transistor 20 and N channel MOS transistor 21 in this embodiment, the present invention can also be applied to a logic circuit receiving an L level input signal in the standby state, such as an NAND circuit and an NOR circuit.

Fourth Embodiment

Figure 7:
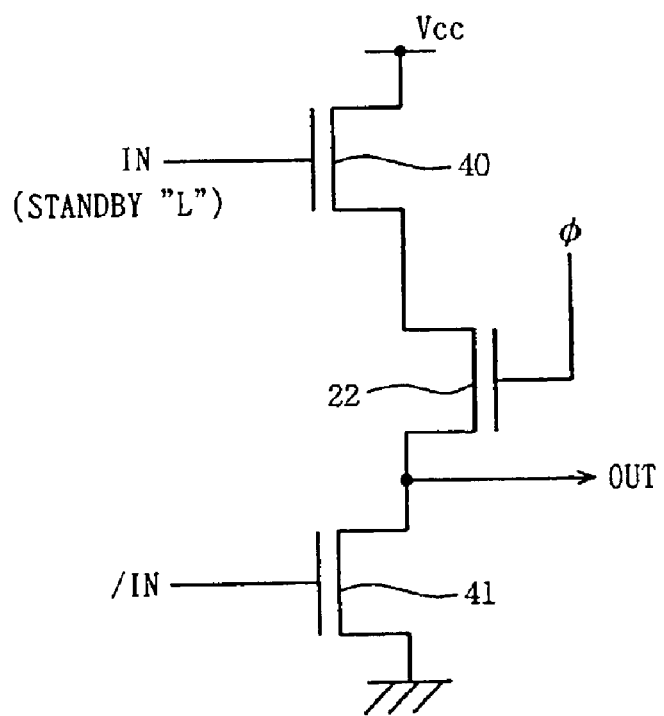
FIG. 7 is a circuit diagram showing the structure of an N—N buffer according to a fourth embodiment of the present invention.

FIG. 7 is a circuit diagram showing the structure of an N—N type buffer in which N channel MOS transistor 22 shown in FIG. 2 is applied. Referring to FIG. 7, an N channel MOS transistor 40 has a low level threshold, and it is connected between power supply node Vcc and N channel MOS transistor 22 and turned on/off in response to input signal IN. An N channel MOS transistor 41 has a low level threshold, it is connected between output node OUT and ground node GND and turned on/off in response to an inverted signal /IN of input signal IN. N channel MOS transistor 22 has an intermediate level threshold, and it is connected between N channel MOS transistor 40 and output node OUT and turned on/off in response to control signal φ. Control signal φ is at the L level when the N—N type buffer is in the standby state and at the H level when it is in the active state.

In the standby state, input signal IN is at the L level and thus N channel MOS transistors 40 and 22 are off. Accordingly, a subthreshold current flowing between power supply node Vcc and output node OUT is decreased.

In the active state, N channel MOS transistor 22 is turned on and thus the circuit operate as a typical N—N type buffer. The effect of hot carriers caused when a high electric field is applied to the drain of N channel MOS transistor 40 can be suppressed.

Fifth Embodiment

Figure 8:
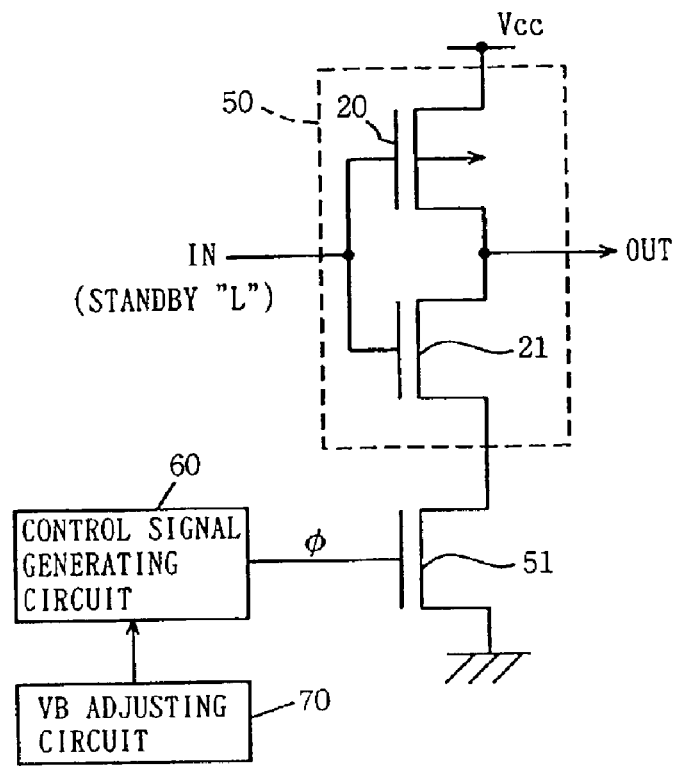
FIG. 8 is a block diagram showing the structure of a semiconductor circuit device according to a fifth embodiment of the present invention.

FIG. 8 is a block diagram showing the structure of a semiconductor circuit device according to a fifth embodiment of the present invention. Referring to FIG. 8, the semiconductor circuit device includes an inverter 50 formed of P channel MOS transistor 20 and N channel MOS transistor 21 and receiving an L level input signal in the standby state, an N channel MOS transistor 51, a control signal generating circuit 60 and a VB adjusting circuit 70. N channel MOS transistor 51 is connected between N channel MOS transistor 21 and ground node GND and turned on/off in response to control signal φ from control signal generating circuit 60. VB adjusting circuit 70 adjusts the L level potential VB of control signal φ.

Figure 9:
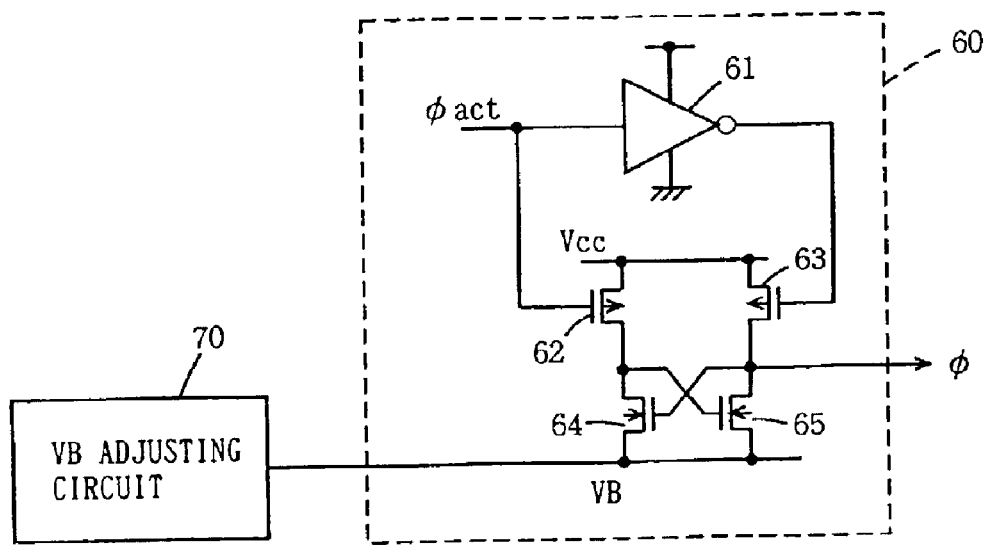
FIG. 9 is a circuit diagram showing the structure of the control signal generating circuit shown in FIG. 8.

FIG. 9 is a circuit diagram showing the structure of control signal generating circuit 60 shown in FIG. 8. Referring to FIG. 9, control signal generating circuit 60 includes an inverter 61, P channel MOS transistors 62 and 63, and N channel MOS transistors 64 and 65. Inverter 61 receives an activation signal φact and outputs an inverted signal /φact thereof. P channel MOS transistor 62 is connected between power supply node Vcc and N channel MOS transistor 64 and turned on/off in response to activation signal φact. P channel MOS transistor 63 is connected between power supply node Vcc and N channel MOS transistor 65 and turned on/off in response to inverted signal /φact of activation signal φact. N channel MOS transistor 64 is connected between P channel MOS transistor 62 and the output node VB from VB adjusting circuit 70, and it receives at its gate the potential of an interconnection node between P channel MOS transistor 63 and N channel MOS transistor 65. N channel MOS transistor 65 is connected between P channel MOS transistor 63 and output node VB from VB adjusting circuit 70, and it receives at its gate the potential of an interconnection node between P channel MOS transistor 62 and N channel MOS transistor 64.

The operation of the thus structured control signal generating circuit 60 will be described below.

When activation signal φact is at the H level, P channel MOS transistors 62 and 63 are off and on, respectively. Since the gate of N channel MOS transistor 64 is supplied with a Vcc level potential, N channel MOS transistor 64 is turned on. Since the gate of N channel MOS transistor 65 is supplied with a VB level potential, N channel MOS transistor 65 is turned off. As a result, control signal φ comes to have the potential Vcc of the interconnection node between P channel MOS transistor 63 and N channel MOS transistor 65.

When activation signal φact is at the L level, P channel MOS transistors 62 and 63 are on and off, respectively. Since the gate of N channel MOS transistor 65 is supplied with the Vcc level potential, N channel MOS transistor 65 is turned on. Since the gate of N channel MOS transistor 64 is supplied with the VB level potential, N channel MOS transistor 64 is turned off. As a result, control signal φ comes to have the potential VB of the interconnection node between P channel MOS transistor 63 and N channel MOS transistor 65.

Figure 10:
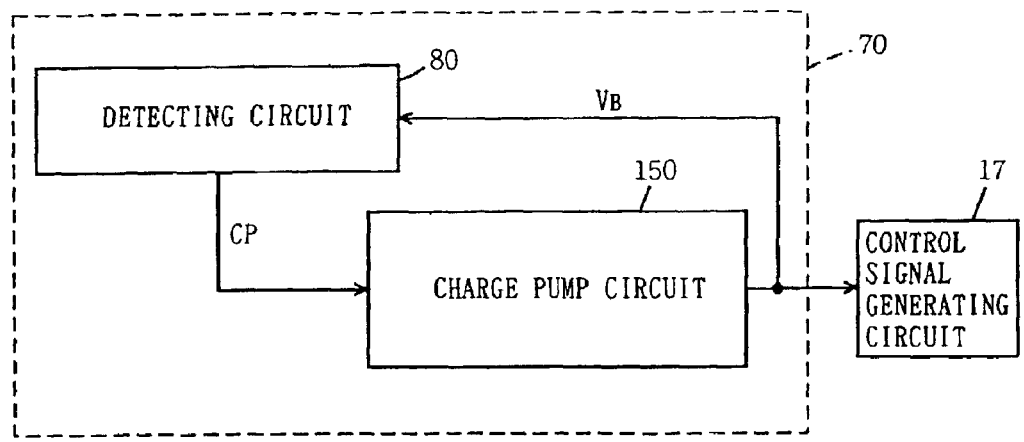
FIG. 10 is a block diagram showing the structure of the VB adjusting circuit shown in FIG. 8.

FIG. 10 is a block diagram showing the structure of VB adjusting circuit 70 shown in FIG. 8. Referring to FIG. 10, VB adjusting circuit 70 includes a detecting circuit 80 and a charge pump circuit 150. Detecting circuit 80 compares output voltage VB of charge pump circuit 150 with a detecting level VBref, outputs an H level charge pump activation signal CP when output voltage VB is higher than detecting level VBref, and outputs an L level charge pump activation signal CP when output voltage VB is at most detecting level VBref.

Figure 11:
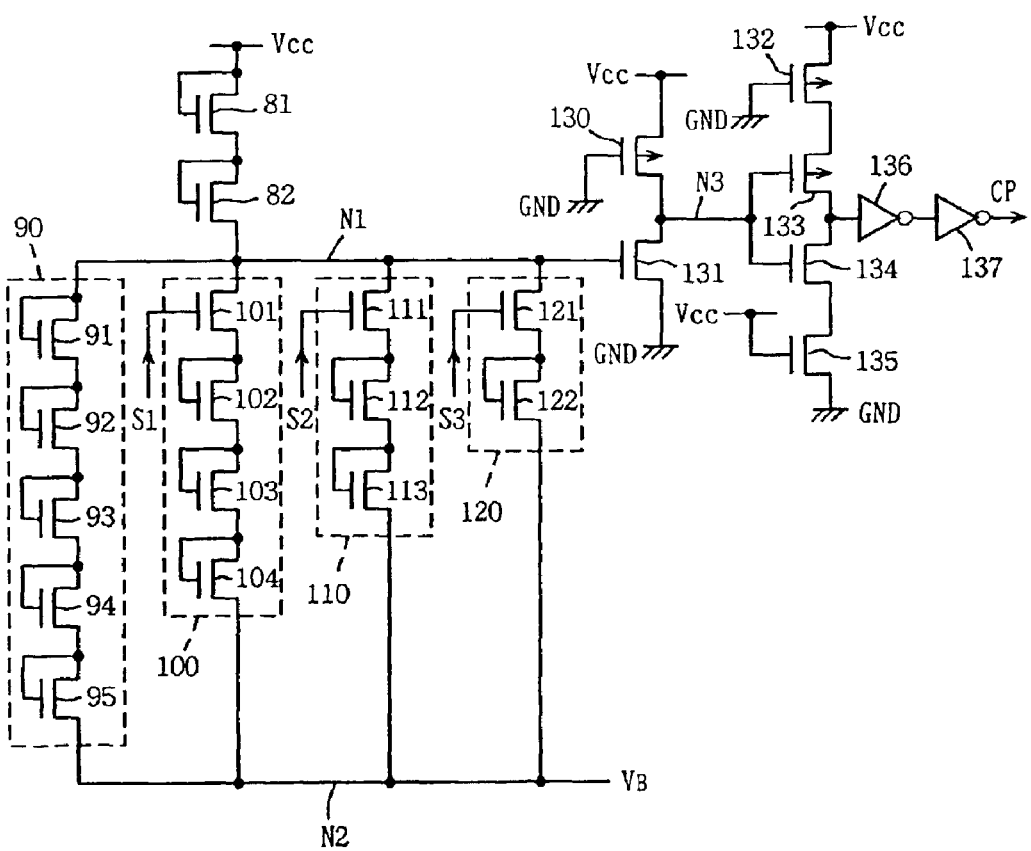
FIG. 11 is a circuit diagram showing the structure of the detecting circuit shown in FIG. 10.

FIG. 11 is a circuit diagram showing the structure of detecting circuit 80 shown in FIG. 10. Referring to FIG. 11, detecting circuit 80 includes diode-connected N channel MOS transistors 81 and 82 connected in series between power supply node Vcc and a node N1, resistance circuits 90, 100, 110 and 120 connected in parallel between node N1 and a node N2 receiving output voltage VB from the charge pump, a P channel MOS transistor 130 connected between power supply node Vcc and a node N3 and receiving a ground voltage at its gate, an N channel transistor 131 connected between node N3 and ground node GND and receiving the potential of node N1 at its gate, P channel MOS transistors 132, 133 and N channel MOS transistors 134, 135 connected in series between power supply node Vcc and ground node GND, and inverters 136, 137. Resistance circuit 90 includes diode-connected N channel MOS transistors 91–95 connected in series between mode N1 and node N2. Resistance circuit 100 includes N channel MOS transistors 101–104. N channel MOS transistor 101 is connected between node N1 and N channel MOS transistor 102 and turned on/off in response to a switching signal S1. N channel MOS transistors 102–104 are connected in series between N channel MOS transistor 101 and node N2 and they are diode-connected. Resistance circuit 110 includes N channel MOS transistors 111–113. N channel MOS transistor 111 is connected between node N1 and N channel MOS transistor 112 and turned on/off in response to a switching signal S2. N channel MOS transistors 112 and 113 are connected in series between N channel MOS transistor 111 and node N2 and they are diode-connected. Resistance circuit 120 includes N channel MOS transistors 121 and 122. N channel MOS transistor 121 is connected between node N1 and N channel MOS transistor 122 and turned/off in response to a switching signal S3. N channel MOS transistor 122 is connected between N channel MOS transistor 121 and a node N2 and it is diode-connected. P channel MOS transistor 132 is connected between power supply node Vcc and P channel MOS transistor 133 and its gate is connected to the ground node. P channel MOS transistor 133 and N channel MOS transistor 134 receive the potential of node N3 at their gates. N channel MOS transistor 135 is connected between N channel MOS transistor 134 and the ground node and its gate receives power supply voltage Vcc.

Figure 12:
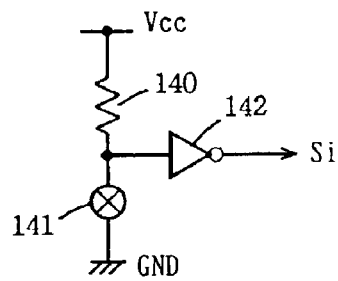
FIG. 12 is a circuit diagram showing the structure of a switching signal generating circuit generating the switching signals Si shown in FIG. 11.

FIG. 12 is a circuit diagram showing the structure of a switching signal generating circuit generating switching signals Si (i=1, 2, 3) shown in FIG. 11. Referring to FIG. 12, the switching signal generating circuit includes a resistor 140, a fuse 141 and an inverter 142. Resistor 140 is connected between power supply node Vcc and fuse 141. Fuse 141 is connected between resistor 140 and ground node GND. Inverter 142 inverts the potential of an interconnection node between resistor 140 and fuse 141 and outputs switching signals Si. The thus structured switching signal generating circuit outputs H level switching signals Si when fuse 141 is not disconnected, and outputs L level switching signals Si when fuse 141 is disconnected.

Figure 13:
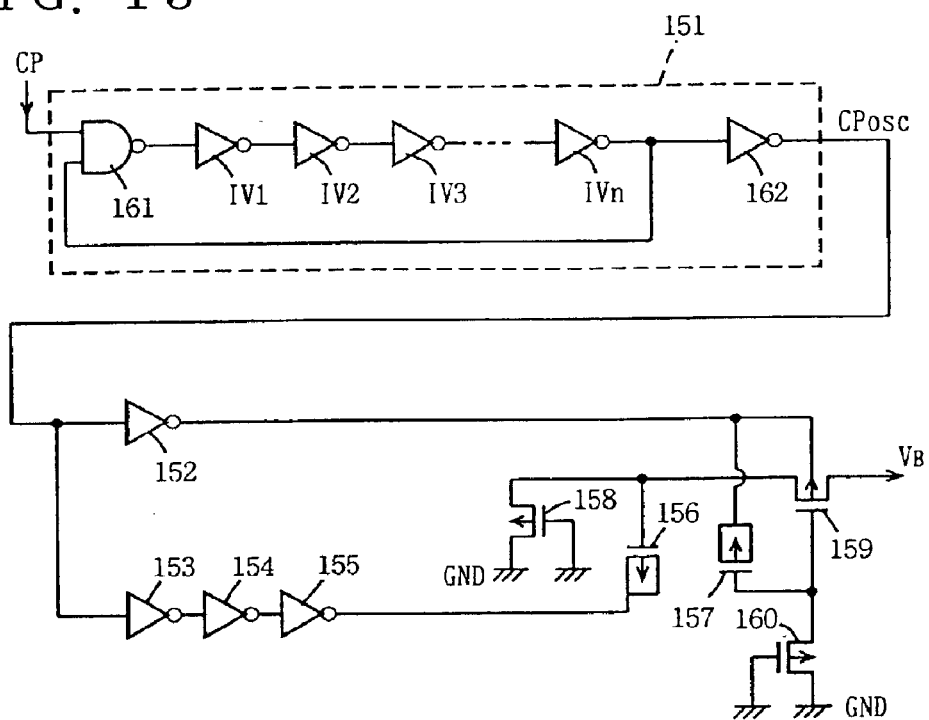
FIG. 13 is a circuit diagram showing the structure of the charge pump circuit shown in FIG. 10.

FIG. 13 is a circuit diagram showing the structure of charge pump circuit 150 shown in FIG. 10. Referring to FIG.

13, charge pump circuit 150 includes a ring oscillator 151, inverters 152–155, PMOS capacitors 156 and 157, and P channel MOS transistors 158–160. Ring oscillator 151 includes an NAND gate 161, a plurality of inverters IV1–IVn and a buffer 162. NAND gate 161 and inverters IV1–IVn are connected in a ring shape and they periodically generate a pulse when charge pump activation signal CP input to NAND gate 161 is at the H level. This pulse is output through buffer 162 as a pulse signal CPosc. Power signal CPosc is supplied through inverters 153–155 to PMOS capacitor 156 and through inverter 152 to PMOS capacitor 157. The supply of pulse signal CPocs causes a charge pump operation, gradually decreasing output voltage VB.

The operation of the thus structured detecting circuit 80 and charge pump circuit 150 will be described below.

It is assumed that all switching signals S1–S3 are at the H level.

When a potential difference between nodes N1 and N2 shown in FIG. 11 is VBN1, VBN1 is approximately expressed as VBN1=(Vcc−VB)×R2/(R1+R2) wherein the combined resistance of N channel MOS transistors 81 and 82 is R1 and the combined resistance of nodes N1 and N2 is R2. At this time, potential VN1 of node N1 is VN1=VB+VBNI. Supposing that the potential of node N1 when the force of P channel MOS transistor 130 to draw node N3 to power supply voltage level Vcc is stronger than the force of N channel MOS transistor 131 to draw node N3 to ground level GND is VBN1ref and the potential of node N2 at this time is detecting level VBref, then VBN1ref=VBref+VBN1.

(1) When output voltage VB from charge pump circuit 150 is higher than detecting level VBref, that is, when potential VN1 of node N1 is higher than VN1ref, the force of N channel MOS transistor 131 to draw node N3 to ground level GND is stronger than the force of P channel MOS transistor 130 to draw node N3 to power supply voltage level Vcc. Thus, the potential of node N3 is ground level GND. As a result, P channel MOS transistor 133 and N channel MOS transistor 134 are on and off, respectively, and H level charge pump activation signal CP is output from detecting circuit 80. Charge pump circuit 150 is activated in response to the charge pump activation signal CP and output voltage VB from charge pump circuit 150 is gradually decreased. Potential VN1 of node N1 accordingly decreases.

(2) When the operation of charge pump circuit 150 causes output voltage VB from charge pump circuit 150 to be at most detecting level VBref, that is, when the operation causes potential VN1 of node N1 to be at most VN1ref, the force of P channel MOS transistor 130 to draw node N3 to power supply voltage level Vcc is stronger than the force of N channel MOS transistor 131 to draw node N3 to ground level GND. Thus, the potential of node N3 attains power supply voltage level Vcc. As a result, P channel MOS transistor 133 and N channel MOS transistor 134 are off and on, respectively, and L level charge pump activation signal CP is output from detecting circuit 80. Charge pump circuit 150 stops its operation in response to the charge pump activation signal CP. After a while since charge pump circuit 150 stops its operation, output voltage VB from charge pump circuit 150 gradually increases. Then, charge pump circuit 150 is activated again to repeat the operation described in (1) and (2) above, and output voltage VB from charge pump circuit 150 is kept at VBref.

When fuse 141 of the switching signal generating circuit generating switching signal S1 is disconnected in this case, switching signal S1 changes from the H level to the L level and N channel MOS transistor 101 is turned off. As a result, combined resistance R2 of nodes N1 and N2 increases because there is no more contribution from resistance circuit 100, and potential difference VBN1 between nodes N1 and N2 thus increases. At this time, the value of VBN1ref is constant and therefore detecting level VBref lowers. By thus selectively disconnecting fuse 141 of the switching signal generating circuit generating switching signals Si, detecting level VBref can be adjusted at a desired value.

Figure 14:
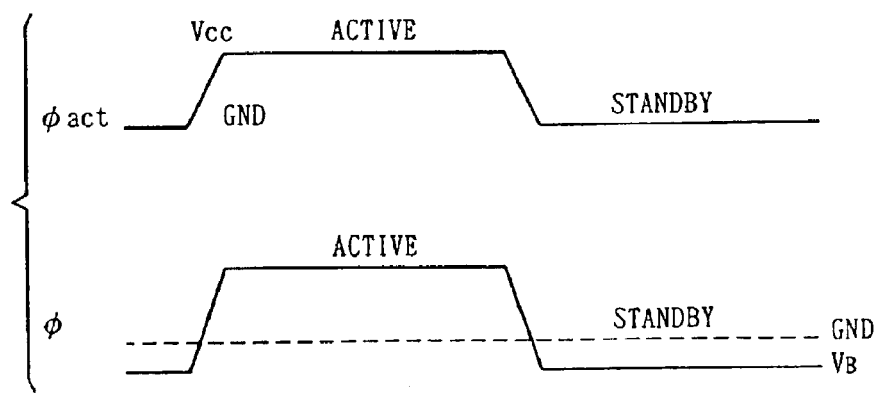
FIG. 14 is a timing chart for describing the operation of the semiconductor circuit device according to the fifth embodiment of the present invention.

The operation of the thus structured semiconductor circuit device will be described below with reference to FIG. 14.

Control signal φ that is at the L level (VB level) in the standby state and at the H (Vcc) level in the active state in synchronization with signal φact that is at the L (GND) level in the standby state and at the H (Vcc) level in the active state is supplied from control signal generating circuit 70 to the gate of N channel MOS transistor 51. As a result, in the standby state, N channel MOS transistor 51 is turned off more strongly than when the voltage of the GND level is supplied to the gate. Accordingly, a subthreshold current flowing between output node OUT and ground node GND can more efficiently be decreased. Meanwhile, N channel MOS transistor 51 is turned on in the active state and inverter 50 thus operates normally.

According to the fifth embodiment, the VB adjusting circuit is provided, so that L level potential VB of control signal φ can be adjusted at a desired value and the value of VB can be kept constant. In accordance with variation in the threshold of a transistor caused when manufactured, therefore, L level potential VB of control signal φ can be set at a value optimum for decreasing the subthreshold current.

Although the present invention has been described with respect to its application to inverter 50, the present invention can also be applied to a logic circuit receiving an L level input signal in the standby state, such as n NAND circuit and an NOR circuit.

Sixth Embodiment

Figure 15:
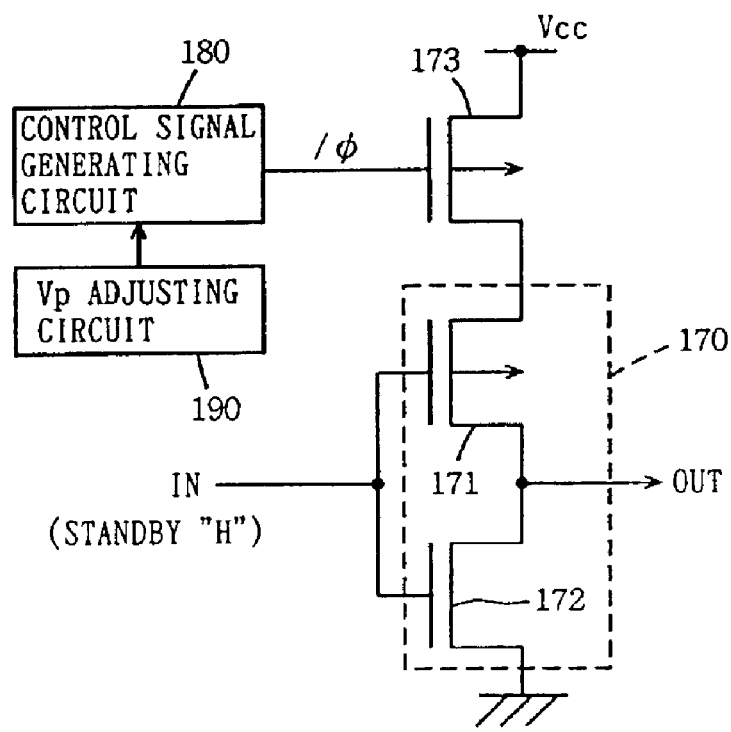
FIG. 15 is a block diagram showing the structure of a semiconductor circuit device according to a sixth embodiment of the present invention.

FIG. 15 is a block diagram showing the structure of a semiconductor circuit device according to a sixth embodiment of the present invention. Referring to FIG. 15, the semiconductor circuit device includes an inverter 170 formed of a P channel MOS transistor 171 and an N channel MOS transistor 172 and receiving an H level input signal in the standby state, a P channel MOS transistor 173, a control signal generating circuit 180 and a Vp adjusting circuit 190. P channel MOS transistor 173 is connected between P channel MOS transistor 171 and power supply node Vcc and turned on/off in response to control signal /φ from control signal generating circuit 180. Vp adjusting circuit 190 adjusts H level potential Vp of control signal /φ.

Figure 16:
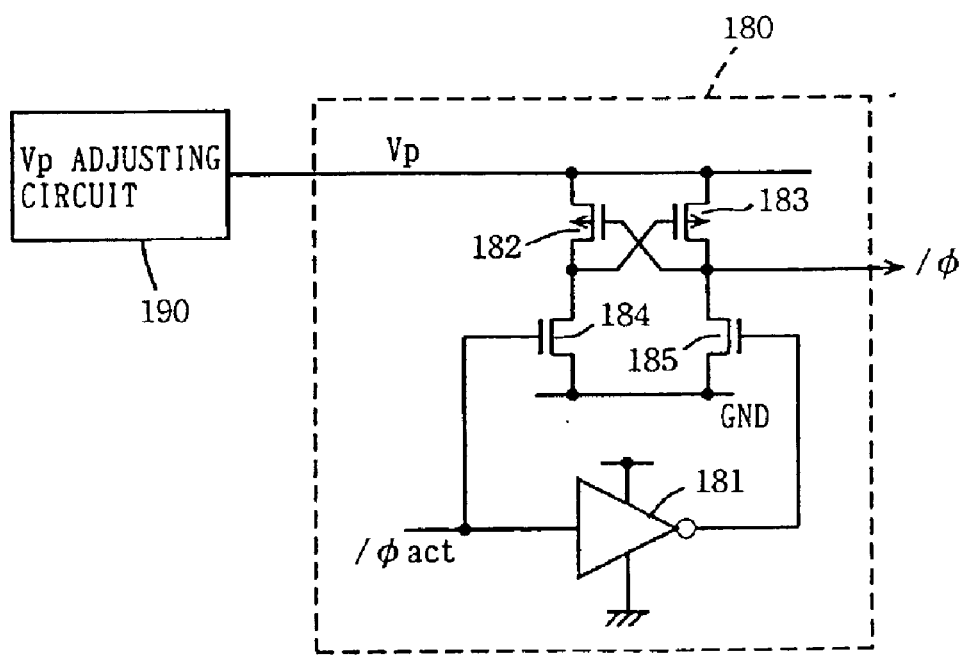
FIG. 16 is a circuit diagram showing the structure of the control signal generating circuit shown in FIG. 15.

FIG. 16 is a circuit diagram showing the structure of control signal generating circuit 180 shown in FIG. 15. Referring to FIG. 16, control signal generating circuit 180 includes an inverter 181, P channel MOS transistors 182 and 183, and N channel MOS transistors 184 and 185. Inverter 181 receives activation signal /φact and outputs inverted signal φact thereof. P channel MOS transistor 182 is connected between an output node Vp from Vp adjusting circuit 190 and N channel MOS transistor 184, and it receives at its gate the potential of an interconnection node between P channel MOS transistor 183 and N channel MOS transistor 185. P channel MOS transistor 183 is connected between output node Vp from Vp adjusting circuit 190 and N channel MOS transistor 185, and it receives at its gate the potential of an interconnection node between P channel MOS transistor 182 and N channel MOS transistor 184. N channel MOS transistor 184 is connected between P channel MOS transistor 182 and ground node GND and turned on/off in response to activation signal /φact. N channel MOS transistor 185 is connected between P channel MOS transistor 183 and ground node GND and turned on/off in response to inverted signal φact of activation signal /φact.

The operation of the thus structured control signal generating circuit 180 will be described below.

When activation signal /φact is at the L level, N channel MOS transistors 184 and 185 are off and on, respectively. Since the gate of P channel MOS transistor 182 is supplied with ground level potential GND, P channel MOS transistor 182 is turned on. Since the gate of P channel MOS transistor 183 is supplied with a Vp level potential, P channel MOS transistor 183 is turned off. As a result, control signal /φ comes to have potential GND of the interconnection node between P channel MOS transistor 183 and N channel MOS transistor 185.

When activation signal /φact is at the H level, N channel MOS transistors 184 and 185 are on and off, respectively. Since the gate of P channel MOS transistor 183 is supplied with ground level potential GND, P channel MOS transistor 183 is turned on. Since the gate of P channel MOS transistor 182 is supplied with the Vp level potential, P channel MOS transistor 182 is turned off. As a result, control signal /φ comes to have potential Vp of the interconnection node between P channel MOS transistor 183 and N channel MOS transistor 185.

Figure 17:
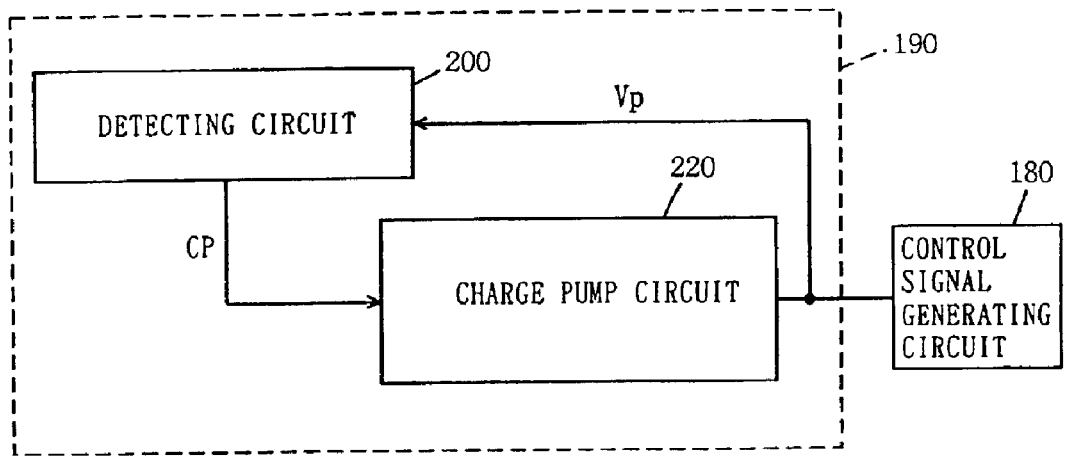
FIG. 17 is a block diagram showing the structure of the Vp adjusting circuit shown in FIG. 15.

FIG. 17 is a block diagram showing the structure of Vp adjusting circuit 190 shown in FIG. 15. Referring to FIG. 17, Vp adjusting circuit 190 includes a detecting circuit 200 and a charge pump circuit 220. Detecting circuit 200 compares output voltage Vp of charge pump circuit 220 with a detecting level Vpref, outputs H level charge pump activation signal CP when output voltage Vp is lower than detecting level Vpref, and outputs L level charge pump activation signal CP when output voltage Vp is at least detecting level Vpref.

Figure 18:
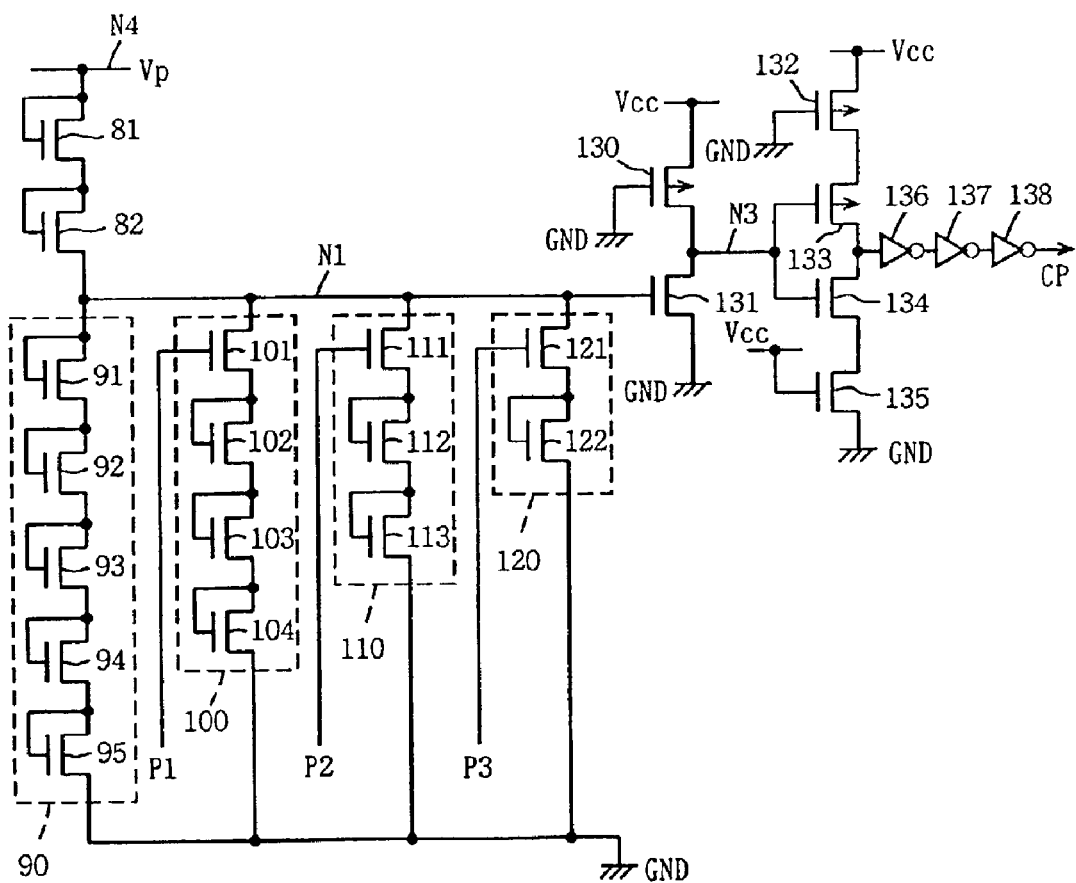
FIG. 18 is a circuit diagram showing the structure of the detecting circuit shown in FIG. 17.

FIG. 18 is a circuit diagram showing the structure of detecting circuit 200 shown in FIG. 17. Referring to FIG. 18, detecting circuit 200 includes a node N4 receiving output voltage Vp from charge pump circuit 220 in place of power supply node Vcc connected to N channel MOS transistor 81 shown in FIG. 11, ground node GND in place of node N2 shown in FIG. 11, switching signals Pi (i=1, 2, 3) in place of switching signals Si (i=1, 2, 3), shown in FIG. 11, input to the gates of N channel MOS transistors 101, 111, 121, and an inverter 138 provided at the output of inverter 137.

Figure 19:
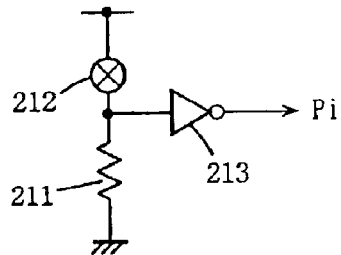
FIG. 19 is a circuit diagram showing a switching signal generating circuit generating the switching signals Pi shown in FIG. 18.

FIG. 19 is a circuit diagram showing a switching signal generating circuit generating switching signals Pi (i=1, 2, 3) shown in FIG. 18. Referring to FIG. 19, the switching signal generating circuit includes a resistor 211, a fuse 212 and an inverter 213. Resistor 211 is connected between fuse 212 and ground node GND. Fuse 212 is connected between power supply node Vcc and resistor 211. Inverter 213 inverts the potential of an interconnection node between resistor 211 and fuse 212 and outputs switching signals Pi. The thus structured switching signal generating circuit outputs L level switching signals Pi when fuse 212 is not disconnected, and outputs H level switching signals Pi when fuse 212 is disconnected.

Figure 20:
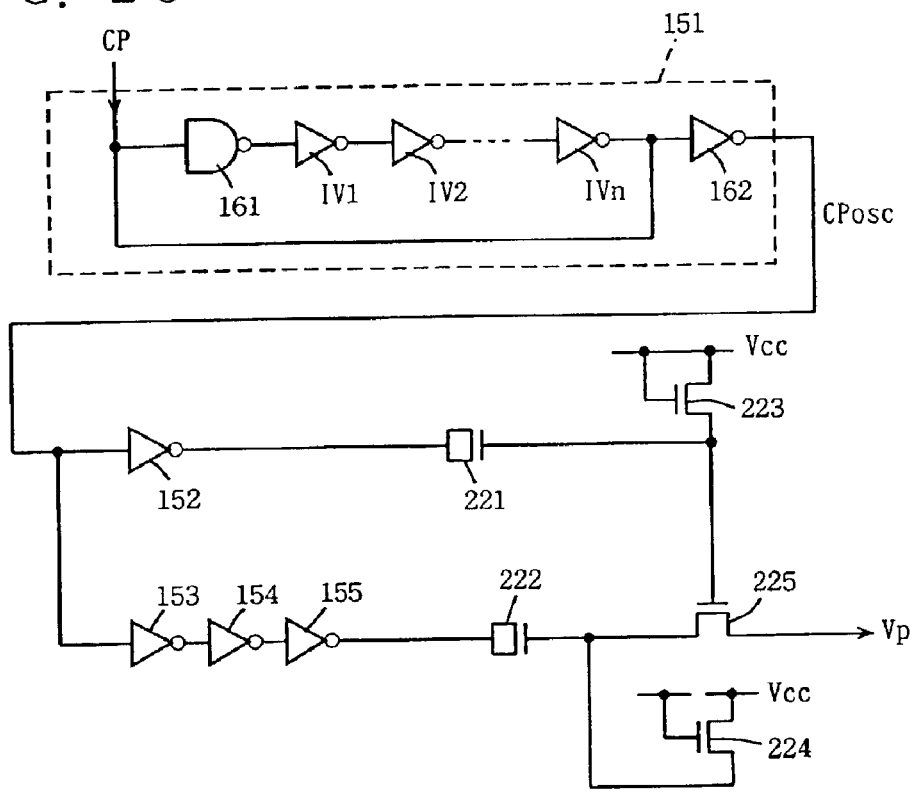
FIG. 20 is a circuit diagram showing the structure of the charge pump circuit shown in FIG. 17.

FIG. 20 is a circuit diagram showing the structure of charge pump circuit 220 shown in FIG. 17. Referring to FIG. 20, charge pump circuit 220 has ring oscillator 151 and inverters 152–155 shown in FIG. 13 and further includes NMOS capacitors 221 and 222 and N channel MOS transistors 223–225. Pulse signal CPosc generated by ring oscillator 151 is supplied through inverter 152 to NMOS capacitor 221 and through inverter 153–155 to NMOS capacitor 222. The supply of pulse signal CPosc causes a charge pump operation, gradually increasing output voltage Vp.

The operation of the thus structured detecting circuit 200 and charge pump circuit 220 will be described below.

It is assumed that all switching signals P1–P3 are at the L level.

When a potential difference between node N1 and ground node GND shown in FIG. 18 is VGN1, VGN1 is approximately expressed as VGN1=Vp×R2/(R1+R2) wherein the combined resistance of N channel MOS transistors 81 and 82 is R1 and the combined resistance of node N1 and ground node GND is R2. At this time, potential VN1 of node N1 is VN1=VGN1. Supposing that the potential of node N1 when the force of N channel MOS transistor 131 to draw node N3 is ground level GND is stronger than the force of P channel MOS transistor 130 to draw node N3 to power supply voltage level Vcc is VGN1ref and the potential of node N4 at this time is detecting level Vpref, then VGN1ref=Vpref× R2/(R1+R2).

(1) When output voltage Vp from charge pump circuit 220 is lower than detecting level Vpref, that is, when potential VN1 of node N1 is lower than VN1ref, the force of P channel MOS transistor 130 to draw node N3 to power supply potential Vcc is stronger than the force of N channel MOS transistor 131 to draw node N3 to ground level GND. Thus, the potential of node N3 is power supply potential Vcc. As a result, P channel MOS transistor 133 and N channel MOS transistor 134 are off and on, respectively, and H level charge pump activation signal CP is output from detecting circuit 200. Charge pump circuit 220 is activated in response to the charge pump activation signal CP and output voltage Vp from charge pump circuit 220 gradually increases. Potential VN1 of node N1 accordingly increases.

(2) When the operation of charge pump circuit 220 causes output voltage Vp from charge pump circuit 220 to be at least detecting level Vpref, that is, when the operation causes potential VN1 of node N1 to be at least VGN1ref, the force of N channel MOS transistor 131 to draw node N3 to ground potential level GND is stronger than the force of P channel MOS transistor 130 to draw node N3 to power supply potential level Vcc. Thus, the potential of node N3 is ground potential level GND. As a result, P channel MOS transistor 133 and N channel MOS transistor 134 are on and off, respectively, and L level charge pump activation signal CP is output from detecting circuit 200. Charge pump circuit 220 stops its operation in response to the charge pump activation signal CP. After a while since charge pump circuit 220 stops its operation, output voltage Vp from charge pump circuit 220 gradually decreases. Then, charge pump circuit 220 is activated again to repeat the operation described in (1) and (2) above, and output voltage Vp from charge pump circuit 220 is kept at Vpref.

When fuse 141 of the switching signal generating circuit generating switching signal P1 is disconnected in this case, switching signal P1 changes from the L level to the H level and N channel MOS transistor 101 is turned on. As a result, combined resistance R2 of node N1 and ground node GND decreases because resistor circuit 100 newly contributes, and the value of R2/(R1+R2) accordingly decreases. At this time, the value of VGN1ref is constant and therefore detecting level Vpref increases. By thus selectively disconnecting fuse 212 of the switching signal generating circuit generating switching signals Pi, detecting level Vpref can be adjusted at a desired value.

Figure 21:
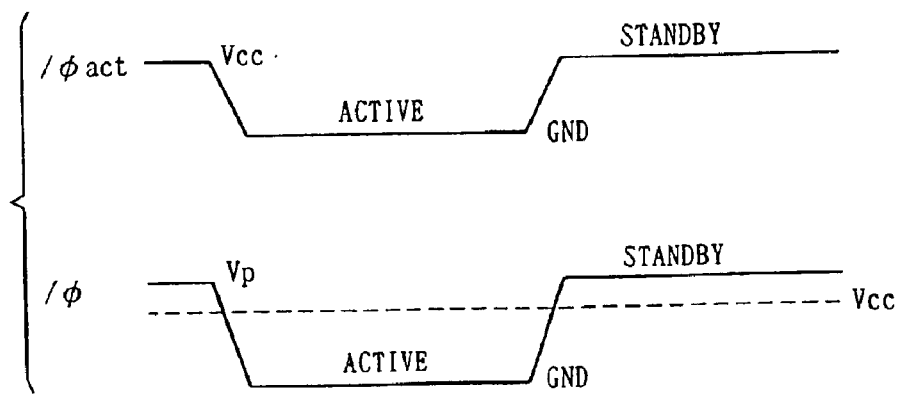
FIG. 21 is a timing chart for describing the operation of the semiconductor circuit device according to the sixth embodiment of the present invention.

The operation of the thus structured semiconductor circuit device will be described below with reference to FIG. 21.

Control signal /ϕ that is at the H (Vp) level in the standby state and at the L level in the active state in synchronization with signal /ϕact that is at the H (Vcc) level in the standby state and at the L level in the active state is supplied from control signal generating circuit 180 to the gate of P channel MOS transistor 173. As a result, in the standby state, P channel MOS transistor 173 is turned off more strongly than when the voltage of the Vcc level is supplied to the gate. Accordingly, a subthreshold current flowing between power supply node Vcc and output node OUT can more efficiently be decreased. In the active state, however, P channel MOS transistor 173 is turned on and therefore inverter 170 operates normally.

According to the sixth embodiment, the Vp adjusting circuit is provided, so that H level potential Vp of control signal /ϕ can be adjusted at a desired value and the value of Vp can be kept constant. In accordance with variation in the threshold of a transistor caused when manufactured, therefore, H level potential Vp of control signal /ϕ can be set at a value optimum for decreasing the subthreshold current.

Although the present invention has been described with respect to its application to inverter 170, the present invention can also be applied to a logic circuit receiving an H level input signal in the standby state, such as an NAND circuit and an NOR circuit.

Seventh Embodiment

Figure 22:
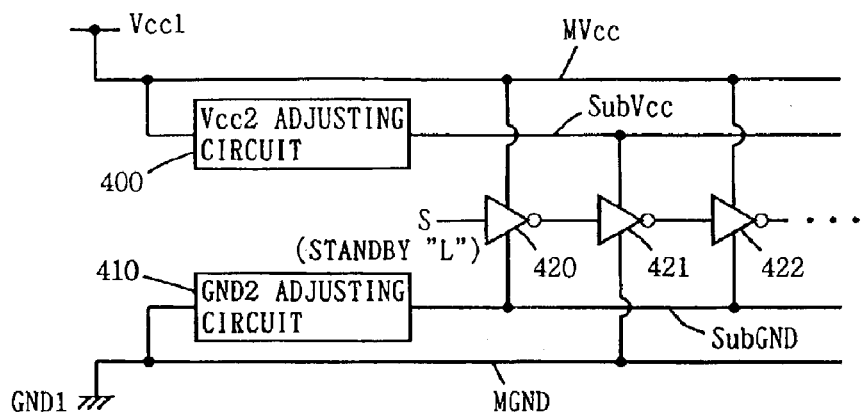
FIG. 22 is a block diagram showing the structure of a semiconductor circuit device according to a seventh embodiment of the present invention.

FIG. 22 is a block diagram showing the structure of a semiconductor circuit device according to a seventh embodiment of the present invention. Referring to FIG. 22, the semiconductor circuit device includes a main power supply line MVcc receiving a power supply voltage Vcc1, a sub power supply line subVcc, a Vcc2 adjusting circuit 400, a main ground line MGND receiving a ground voltage GND 1, a sub ground line subGND, a GND2 adjusting circuit 410 and inverter circuits 420–422. Vcc2 adjusting circuit 400 is connected between main power supply line MVcc and sub power supply line subVcc, and it supplies sub power supply line subVcc with power supply voltage Vcc1 in the active state, supplies sub power supply line subVcc with a voltage Vcc2 lower than power supply voltage Vcc1 in the standby state, and adjusts voltage Vcc2 at a desired level. GND2 adjusting circuit 410 is connected between main ground line MGND and sub ground line subGND, and it supplies sub ground line subGND with ground voltage GND1 in the active state, supplies sub ground line subGND with a voltage GND2 higher than ground voltage GND1 in the standby state, and adjusts voltage GND2 at a desired level. Inverter circuits 420 and 422 are connected between main power supply line MVcc and sub ground line subGND and they receive an L level input signal in the standby state. Inverter circuit 421 is connected between sub power supply line subVcc and main ground line MGND and it receives an H level input signal in the standby state. Here, inverter circuits 420–422 have a similar structure to inverter 50 shown in FIG. 8.

The operation of the thus structured circuit will be described below.

In the active state, sub power supply line subVcc is supplied with power supply voltage Vcc1 by Vcc2 adjusting circuit 400, and sub ground line subGND is supplied with ground voltage GND1 by GND2 adjusting circuit 410. Accordingly, inverter circuits 420–422 operate normally.

In the standby state, Vcc2 adjusting circuit 400 causes sub power supply line subVcc to have voltage Vcc2 lower than power supply voltage Vcc1, and GND2 adjusting circuit 410 causes sub ground line subGND to have voltage GND2 higher than ground voltage GND 1. Thus, the source voltage of N channel MOS transistors in inverter circuits 420 and 422 increase from GND1 to GND2 while the source voltage of a P channel MOS transistor in inverter circuit 421 decreases from Vcc1 to Vcc2. The levels of voltage Vcc2 of sub power supply line subVcc and voltage GND2 of sub ground line subGND at this time are adjusted at desired values by Vcc2 adjusting circuit 400 and GND2 adjusting circuit 410, respectively.

As a result, a subtreshold current flowing between the output node of inverter 421 and sub power supply line subVcc as well as the output node of inverters 420, 422 and sub ground line subGND is more efficiently decreased.

According to the seventh embodiment, Vcc2 adjusting circuit 400 and GND2 adjusting circuit 410 are provided, so that the voltages of sub power supply line subVcc and sub ground line subGND in the standby state can be adjusted at desired levels. Therefore, voltage Vcc2 of sub power supply line subVcc and voltage GND2 of sub ground line subGND can be adjusted at optimum levels in accordance with a situation, and thus the subthreshold current can more efficiently be decreased.

Eighth Embodiment

Figure 23:
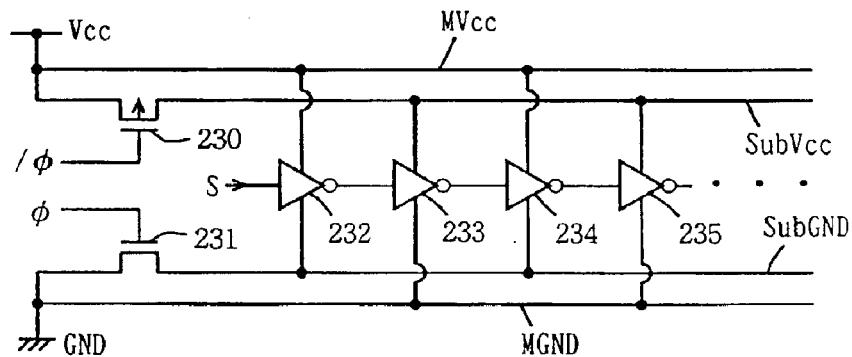
FIG. 23 is a block diagram showing the structure of a semiconductor circuit device according to an eighth embodiment of the present invention.

FIG. 23 is a block diagram showing the structure of a semiconductor circuit device according to an eighth embodiment of the present invention. Referring to FIG. 23, the semiconductor circuit device includes main power supply line MVcc, sub power supply line subVcc, a P channel MOS transistor 230, main ground line MGND, sub ground line subGND, an N channel MOS transistor 231, and inverter circuits 232–235. P channel MOS transistor 230 is connected between main power supply line MVcc and sub power supply line subVcc and turned on/off in response to inverted signal /ϕ of control signal ϕ. N channel MOS transistor 231 is connected between main ground line MGND and sub ground line subGND and turned on/off in response to control signal ϕ. Inverter circuit 232 and 234 are connected between main power supply line MVcc and sub ground line subGND and they receive an L level input signal in the standby state. Inverter circuits 233 and 235 are connected between sub power supply line subVcc and main ground line MGND and they receive an H level input signal in the standby state.

Figure 24:
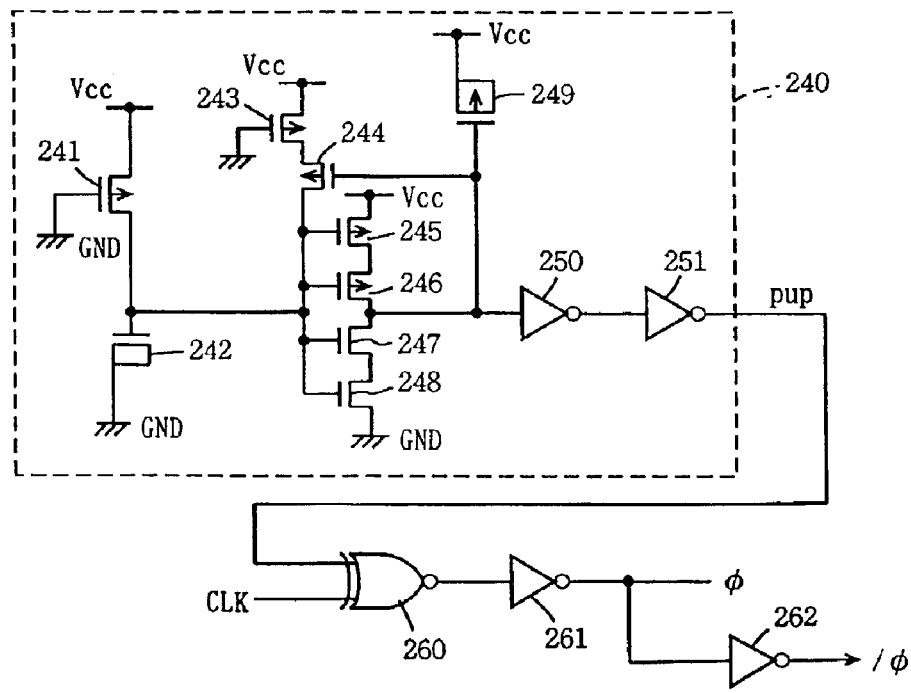
FIG. 24 is a block diagram showing the structure of a control signal generating circuit generating the control signal shown in FIG. 23.

FIG. 24 is a block diagram showing the structure of a control signal generating circuit generating control signals ϕ and /ϕ shown in FIG. 23. Referring to FIG. 24, the control signal generating circuit includes a power-on reset circuit 240, an exclusive NOR circuit 260, and inverters 261 and 262.

Power-on reset circuit 240 includes a P channel MOS transistor 241 and an NMOS capacitor 242 connected in series between power supply node Vcc and ground node GND, P channel MOS transistors 243 and 244 connected in series between power supply node Vcc and an interconnection node between P channel MOS transistor 241 and NMOS capacitor 242, P channel MOS transistors 245 and 246 and N channel MOS transistors 247 and 248 connected in series between power supply node Vcc and ground node GND and receiving at their gates the potential of the interconnection node between P channel MOS transistor 241 and NMOS capacitor 242, a PMOS capacitor 249 connected between power supply node Vcc and an interconnection node between P channel MOS transistor 246 and N channel MOS transistor 247, an inverter 250 receiving at its input the potential of the interconnection node between P channel MOS transistor 246 and N channel MOS transistor 247, and an inverter 251 inverting the output of inverter 250 and outputting it as a power-on reset signal pup. Power-on reset circuit 240 raises power-on reset signal pup for prescribed time H when power supply voltage Vcc rises.

Exclusive NOR circuit 260 receives power-on reset signal pup and a clock signal CLK. Inverter 261 inverts an output from exclusive NOR circuit 260 and outputs it as control signal φ. Inverter 262 inverts the output (control signal φ) from inverter 261 and outputs it as control signal /φ.

Figure 25:
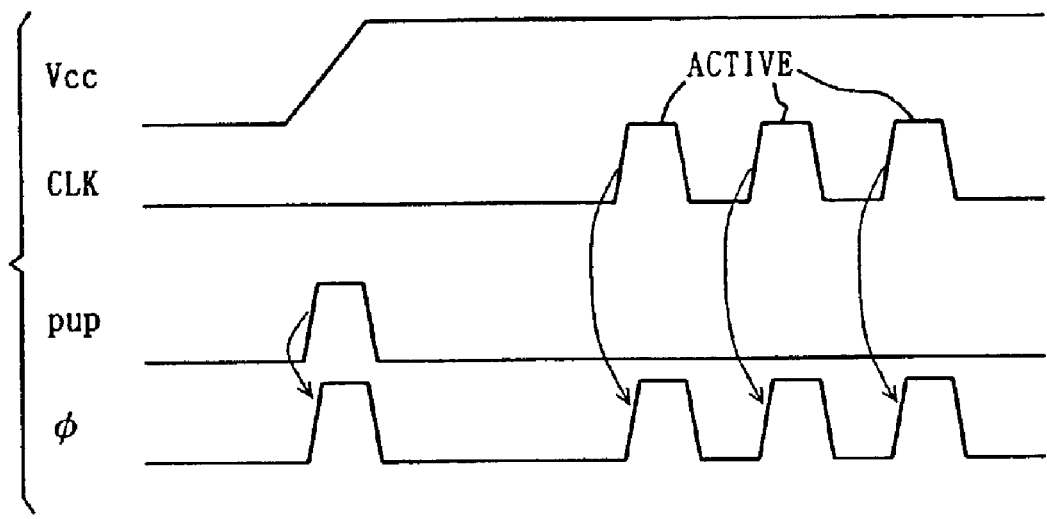
FIG. 25 is a timing chart for describing the operation of a logic circuit according to the eighth embodiment of the present invention.

The operation of the thus structured circuit will be described below with reference to FIG. 25.

When a power supply is turned on, that is, when power supply voltage Vcc gradually rises, power-on reset signal pup is instantaneously raised to the H level by power-on reset circuit 240. Accordingly, control signal φ is instantaneously rises to the H level and control signal /φ instantaneously falls. While control signal φ is at the H level, that is, while control signal /φ is at the L level, P channel MOS transistor 230 and N channel MOS transistor 231 are in the on state, and sub power supply line subVcc and sub ground line subGND are charged to power supply potential level Vcc and ground level and GND, respectively. When power-on reset signal pup then falls to the L level, control signal φ falls to the L level and control signal /φ rises to the H level, so that P channel MOS transistor 230 and N channel MOS transistor 231 are turned off.

The standby state will be described below.

Since control signal φ and control signal /φ are at the L level and the H level at this time, P channel MOS transistor 230 and N channel MOS transistor 231 are off.

Since inverters 232 and 234 receive an L level input signal, a subthreshold current flowing between the respective output nodes and the sub ground line is decreased by N channel MOS transistor 231. Since inverters 233 and 235 receive an H level input signal, a subthreshold current between the sub power supply line subVcc and the respective output nodes is decreased by P channel MOS transistor 230.

The operation in a transition from the standby state to the active state will be described below.

When clock signal CLK rises from the L level to the H level, inverters 232–235 make a transition from the standby state to the active state. At this time, control signal φ changes from the L level to the H level while control signal /φ changes from the H level to the L level. In response to the control signals, P channel MOS transistor 230 and N channel MOS transistor 231 change from the off state to the on state. Since sub power supply line subVcc and sub ground line subGND have sufficiently be charged to power supply potential level Vcc and ground level GND, respectively, inverters 232–235 immediately start operation. When CLK falls from the H level to the L level, inverters 232–235 make a transition from the active state to the standby state.

According to the eighth embodiment, when a power supply is turned on, P channel MOS transistor 230 and N channel MOS transistor 231 are turned on and sub power supply line subVcc and sub ground line subGND are charged to power supply potential level Vcc and ground level GND, respectively. Thus, inverters 232–235 operate normally even immediately after a power supply is turned on. In a transition from the standby state to the active state, sub power supply line subVcc and sub ground line subGND are also charged to power supply potential level Vcc and ground level GND, respectively. Inverters 232–235 thus operate normally.

The present invention has been described with respect to its application to inverters 232–235, the present invention can also be applied to a logic circuit receiving an L or H level input signal in the standby state, such as an NAND circuit and an NOR circuit.

Ninth Embodiment

The first to eighth embodiments cannot be applied to a logic circuit in which an input signal is not settled at either the L level or the H level in the standby state. The ninth embodiment aims to solve this problem.

Figure 26:
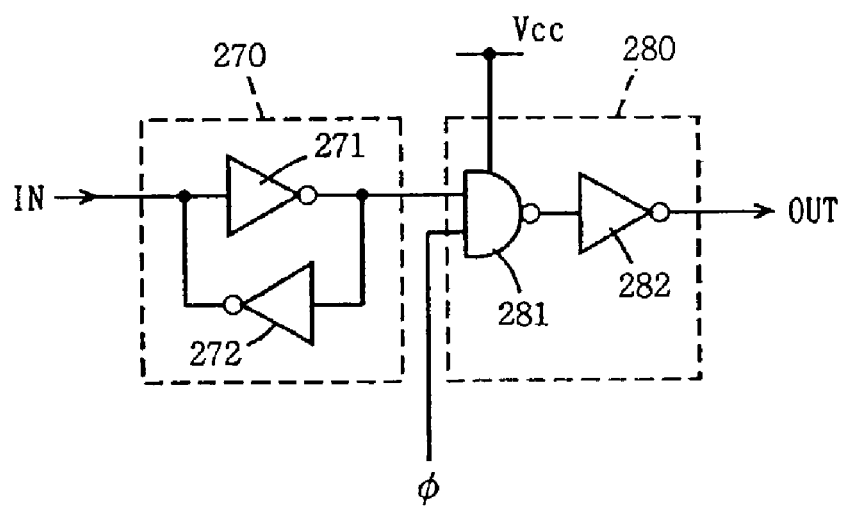
FIG. 26 is a block diagram showing the structure of a logic circuit according to a ninth embodiment of the present invention.

FIG. 26 is a block diagram showing the structure of a logic circuit according to a ninth embodiment of the present invention. Referring to FIG. 26, the logic circuit includes a latch circuit 270 including inverters 271 and 272, and a logic control circuit 280. Logic control circuit 280 includes an NAND circuit 281 and an inverter 282. Latch circuit 270 includes inverters 271 and 272 and holds the level of input signal IN. NAND circuit 281 receives at its input an output from latch circuit 270 and control signal φ that is at the L level in the standby state and at the H level in the active state. Inverter 282 inverts the output from latch circuit 270.

The operation of the thus structured logic circuit will be described below.

In the standby state, NAND circuit 281 receives L level control signal φ at one input terminal. Thus, NAND circuit 281 always outputs an H level signal regardless of the output from latch circuit 270 that is input to the other input terminal. As a result, logic control circuit 280 outputs an L level signal.

Meanwhile, in the active state, NAND circuit 281 receives H level control signal φ at one input terminal. Thus, NAND circuit 281 inverts and outputs the output from logic circuit 270 that is input to the other input terminal. As a result, logic control circuit 280 outputs the output signal from latch circuit 270 as it is.

According to the ninth embodiment, an L level signal is always output regardless of the level of a signal latched by latch circuit 270 in the standby state, and the latched signal is output as it is in the active state. Therefore, the same effect as the logic circuits receiving an L level input signal in the standby state in the first to eighth embodiments can be achieved.

When an OR circuit is provided in place of NAND circuit 281 and inverter 282 and a control signal that is at the H level in the standby state and at the L level in the active state is input to the OR circuit, an H level signal is always output regardless of the level of a latched signal in the standby state, and input signal IN is output as it is in the active state. Therefore, the same effect as the logic circuits receiving an H level input signal in the standby state in the first to eighth embodiments can be achieved.

Tenth Embodiment

Figure 27:
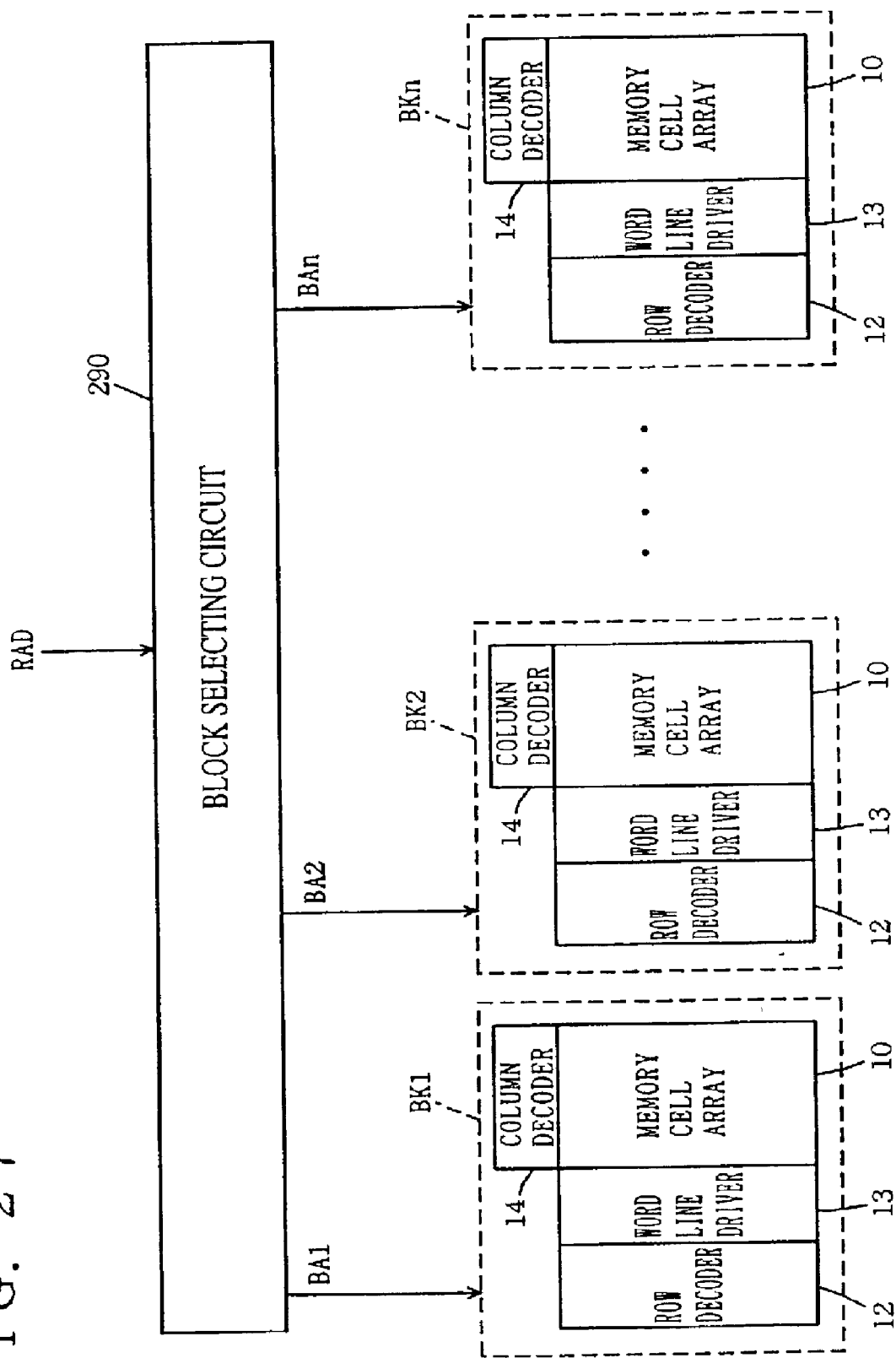
FIG. 27 is a block diagram showing the overall structure of a DRAM according to a tenth embodiment of the present invention.

FIG. 27 is a block diagram showing the overall structure of a DRAM according to a tenth embodiment of the present invention. Referring to FIG. 27, the DRAM includes a block selecting circuit 290 and blocks BK1–BKn. Block selecting circuit 290 outputs block selecting signals BA1–BAn in response to row address signal RAD. Blocks BK1–BKn each include a memory cell array 10, a row decoder 12, a word line driver 13 and a column decoder 14, and they are activated in response to corresponding block selecting signals BA1–BAn.

Figure 28:
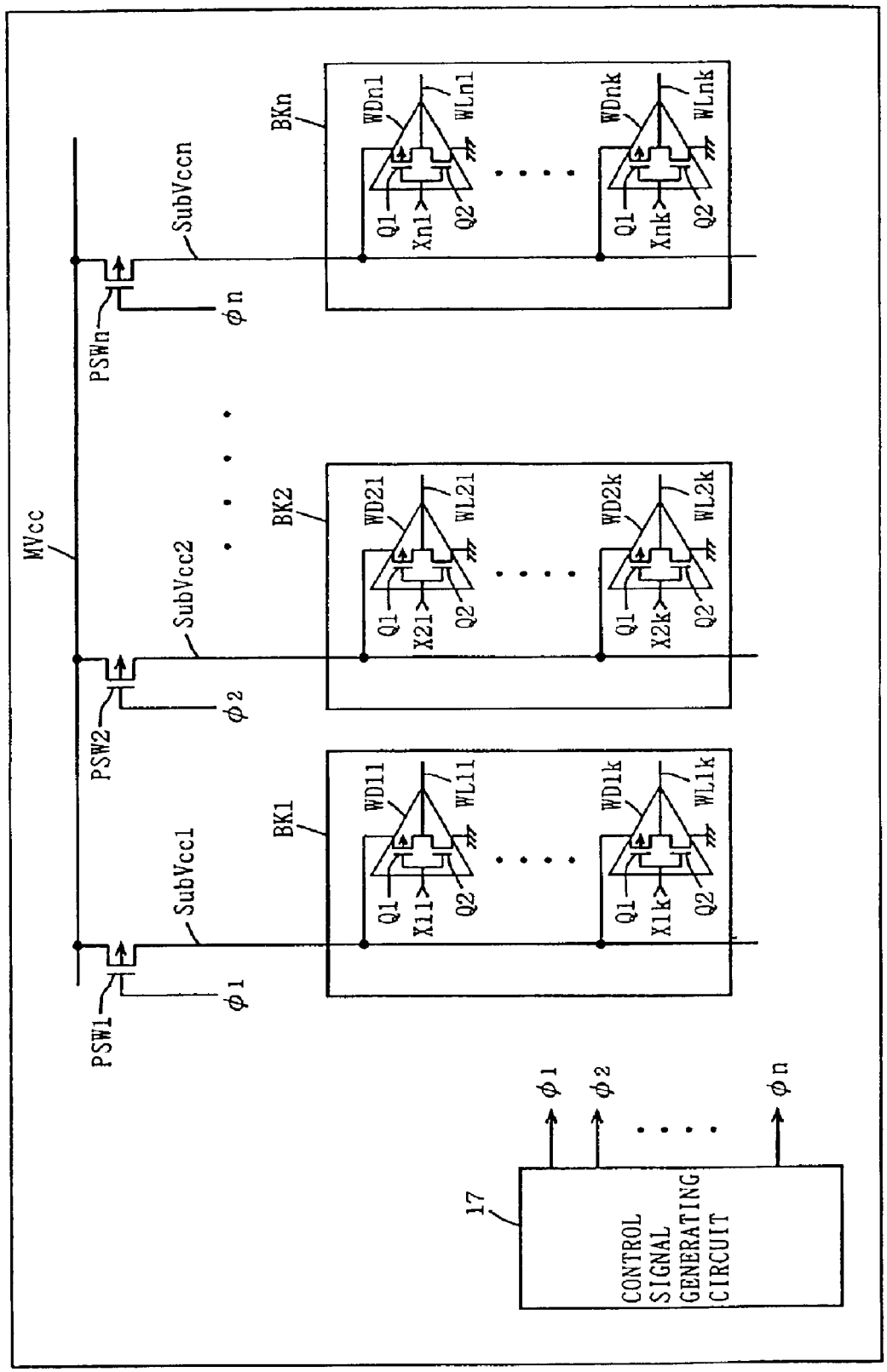
FIG. 28 is a block diagram of the structure of the block-divided DRAM shown in FIG. 27, showing word drivers as an example.

FIG. 28 is a block diagram of the structure of the block-divided DRAM shown in FIG. 27, showing word line drivers 13 as an example. Referring to FIG. 28, the DRAM includes main power supply line MVcc, control signal generating circuit 17, block selecting transistors PSW1–PSWn, and blocks BK1–BKn. Each block BKj (j=1–n) includes k word drivers WDj1–WDjk (j=1–n) connected to one of sub power supply lines subVcc1–subVccn, and k word lines WLj1–WLjk (j=1–n). Control signal generating circuit 17 generates control signals φi in response to block selecting signals BAi from block selecting circuit 290. Block selecting transistors PSW1–PSWn are provided corresponding to sub power supply lines subVcc1–subVccn, connected between corresponding sub power lines subVcc1–subVccn and main power supply line MVcc, and turned on/off in response to corresponding control signals φi. Word line drivers WDj1–WDjk are each formed of a CMOS inverter including a P channel MOS transistor Q1 and an N channel MOS transistor Q2. Word line drivers WDj1–WDjk are activated in response to decode signals Xj1–Xjk generated by the row decoder and they drive word lines WLj1–WLjk.

Figure 29:
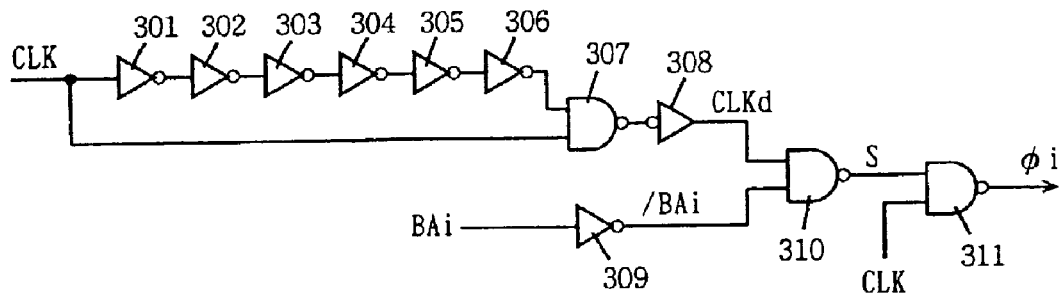
FIG. 29 is a circuit diagram showing the structure of a $\phi i$ generating circuit included in the control signal generating circuit shown in FIG. 28.

FIG. 29 is a circuit diagram showing the structure of a circuit generating control signals φi included in control signal generating circuit 17 shown in FIG. 28. Referring to FIG. 29, control signal generating circuit 17 includes inverters 301–306, 308, 309 and NAND circuits 307, 310, 311. Inverters 301–306 are connected in series, inverter 301 receives clock signal CLK, and the output of inverter 306 is connected to one input of NAND circuit 307. NAND circuit 307 receives the output from inverter circuit 306 and clock signal CLK. Inverter 308 inverts an output from NAND circuit 307. Inverter 309 receives block selecting signals BAi and outputs inverted signals/BAi thereof. NAND circuit 310 receives an output signal CLKd from inverter 308 and output signals/BAi from inverter 309. NAND circuit 311 receives an output signal S from NAND circuit 310 and clock signal CLK. Inverter 311 outputs control signals i. Here, n same circuits as the thus structured φi generating circuit are provided in control signal generating circuit 17.

Figure 30:
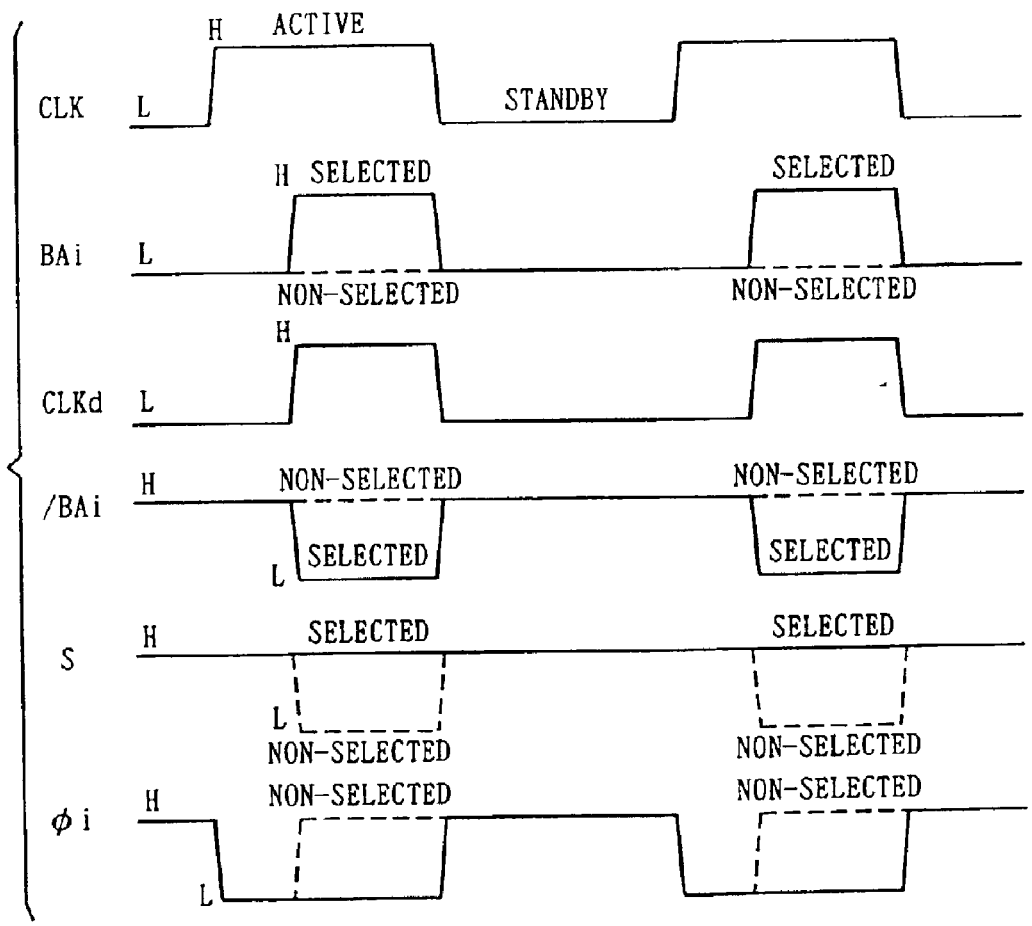
FIG. 30 is a timing chart for describing the operation of the $\phi i$ generating circuit shown in FIG. 29.

The operation of the thus structured φi generating circuit will be described below with reference to FIG. 30.

When clock signal CLK is at the L level, block selecting signals BAi (i=1–n) and output signal CLKd from inverter 308 are at the L level and therefore control signals φi (i=1–n) are at the H level. At this time, the DRAM is in the standby state.

When clock signal CLK rises from the L level to the H level, control signals φi (i=1–n) attain the L level and the DRAM is in the standby state.

Thereafter, when output signal CLKd from inverter 308 rises from the L level to the H level, a block selecting signal BAj corresponding to a block BKj to be selected for activation by block selecting circuit 290 simultaneously rises to the H level. As a result, a control signal φi remains to be at the L level.

Meanwhile, block selecting signals BAi corresponding to blocks BKi other than block Bkj remain to be at the L level. Thus, control signals φi except control signal φj change from the L level to the H level.

When clock signal CLK falls from the H level to the L level, all block selecting signals BAi and output signal CLKd from inverter 308 attain the L level. Accordingly, all control signals φi attain the H level.

The operation of the thus structured DRAM will be described below, using activation of block BKj as an example.

In the standby state, control signals φi (i=1–n) generated from control signal generating circuit 17 are all at the H level and therefore block selecting transistors PSW1–PSWn are all off. As a result, a subthreshold current flowing through write drivers WDi1–WDik included in each one of blocks BK1–BKn is decreased.

In a transition from the standby state to the active state, control signals φi (i=1–n) all change from the H level to the L level and therefore all block selecting transistors PSW1–PSWn are turned on. As a result, all sub power supply lines subVcc are connected to the main power supply line and charged to power supply potential Vcc.

Then, block address signal BAj corresponding to block BKj to be activated by block selecting circuit 290 rises to the H level, and control signals φi other than control signal φj change from the L level to the H level. Since control signal φj remains to be at the L level at this time, block selecting transistor PSWj keeps its on state. Since the transition from the standby state to the active state till block address signal BAj rises to the H level, sub power supply line subVccj has sufficiently be charged to power supply potential Vcc. It reduces the loss of access time since selection of block BKj to start of operation of a word line driver. Meanwhile, block selecting transistors PSW1–PSWn other than block selecting transistor PSWj receiving control signal φj are turned off. Therefore, this decreases a subthreshold current flowing through word drivers WDi1–WDik included in blocks BKi that are not selected by block selecting circuit 290.

According to the tenth embodiment, block selecting transistors PSW1–PSWn are provided corresponding to blocks BK1–BKn, all block selecting transistors PSW1–PSWn are turned on when the DRAM changes from the standby state to the active state and, when a certain block BKj is selected thereafter, block selecting transistors PSWi corresponding to all blocks BKi other than the selected block BKj are turned off. Thus, block BKj is activated when sub power supply line subVccj has sufficiently be charged to power supply potential Vcc. This reduces the loss of access time from selection of block BKj to start of operation of a word line driver.

Although all control signals φi (i=1–n) fall from the H level to the L level when clock signal CLK rises from the L level to the H level in this embodiment, only m (m<n) control signals φi including control signal φj corresponding to selected block BKj may fall from the H level to the L level when clock signal CLK rises from the L level to the H level and thereafter only (m−1) control signals φi other than control signal φj may rise from the L level to the H level. The same effect can also be achieved in this case.

Although word driver 13 has been described as an example of the logic circuit included in each block BKi, a logic circuit in the column decoder may also be used.

Eleventh Embodiment

In an eleventh embodiment, the concept of the tenth embodiment is applied to a DRAM that is two-dimensionally divided into blocks.

Figure 31:
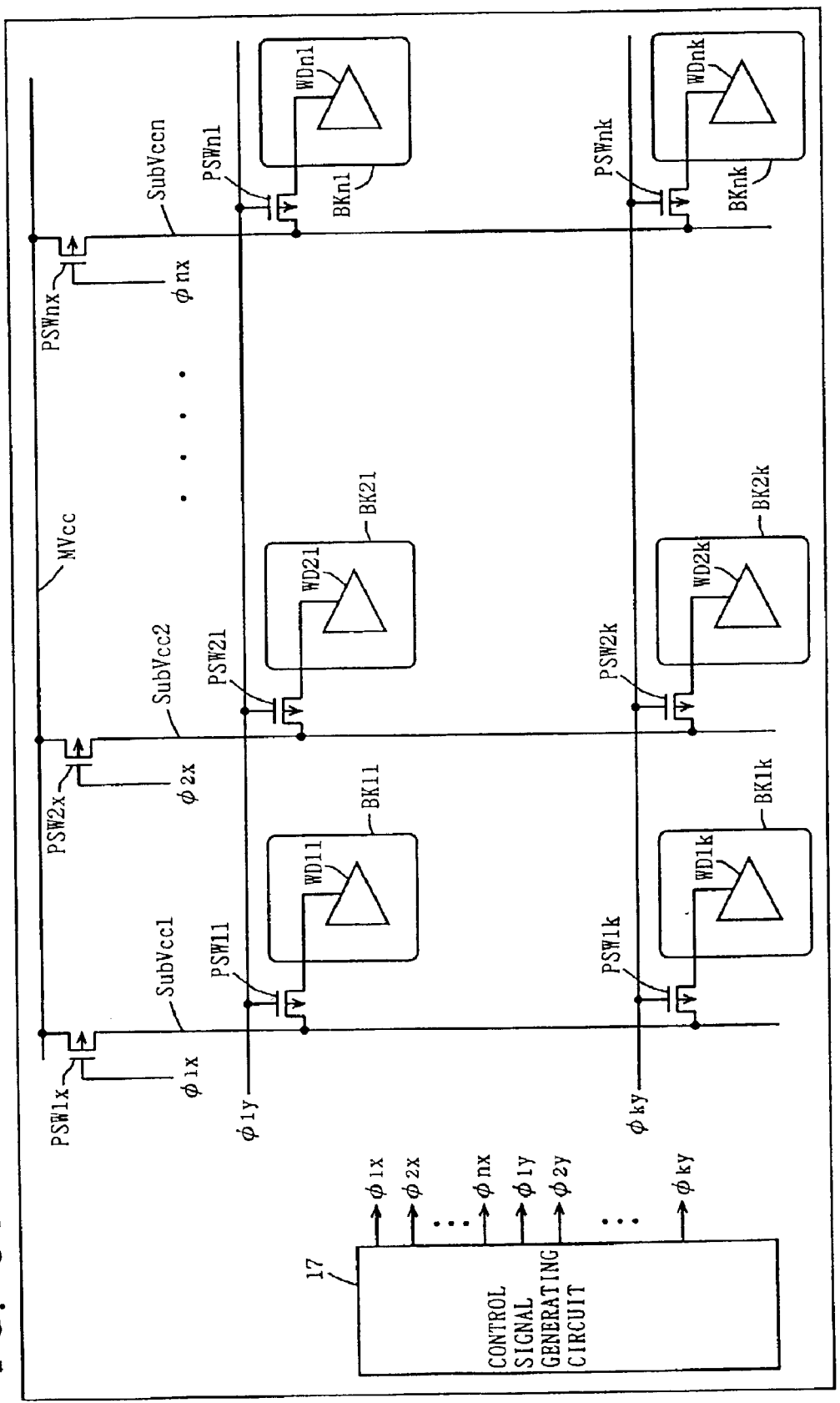
FIG. 31 is a block diagram showing the structure of a DRAM two-dimensionally divided into blocks.

FIG. 31 is a block diagram showing the structure of a DRAM that is two-dimensionally divided into blocks. Referring to FIG. 31, the DRAM includes main power supply line MVcc, control signal generating circuit 17, block selecting transistors PSWix (i=1–n) and PSWij (i=1–n, j=1–k), and blocks BKij (i=1–n, j=1–k). Block selecting transistors PSWix (i=1–n) are connected between main power supply line MVcc and corresponding sub power supply lines subVcci (i=1–n) and turned on/off in response to corresponding control signals φix (i=1–n). Blocks BKij (i=1–n, j=1–k) each include a word line driver WDij (i=1–n, j=1–k) similar to that shown in FIG. 28. Block selecting transistors PSWij (i=1–n, j=1–k) are connected between corresponding sub power supply lines sub Vccix (i=1–n) and word line drivers WDij (i=1–n, j=1–k) included in corresponding blocks BKij (i=1–n, j=1–k) and turned on/off in response to corresponding control signals ϕjy (j=1–k). Control signal generating circuit 17 generates control signals ϕix (i=1–n) in response to block selecting signals BAix (i=1–n) from block selecting circuit 290 and also generates control signals ϕjy (j=1–k) in response to block selecting signals BAjy (j=1–k).

Figure 32:
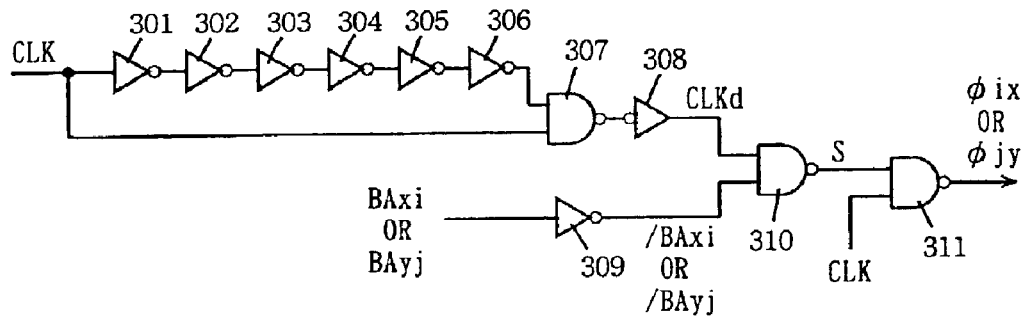
FIG. 32 is a circuit diagram showing the structure of a circuit generating $\phi ix$ (i=1–n) and $\phi jy$ (j=1–k) included in the control signal generating circuit shown in FIG. 31.

FIG. 32 is a circuit diagram showing the structure of a circuit generating ϕix (i=1–n) and ϕjy (j=1–k) included in control signal generating circuit 17 shown in FIG. 31. The circuit is the same as the one shown in FIG. 29 except that the circuit shown in FIG. 32 receives block selecting signals BAix (i=1–n) or BAjy (j=1–k) instead of block selecting signals BAi (i=1–n) input to inverter 309. The circuit outputs control signals ϕix (i=1–n) when block selecting signals BAix (i=1–n) are input to inverter 309 and outputs control signals ϕiy (j=1–k) when block selecting signals BAjy (j=1–k) are input to inverter 309.

Figure 33:
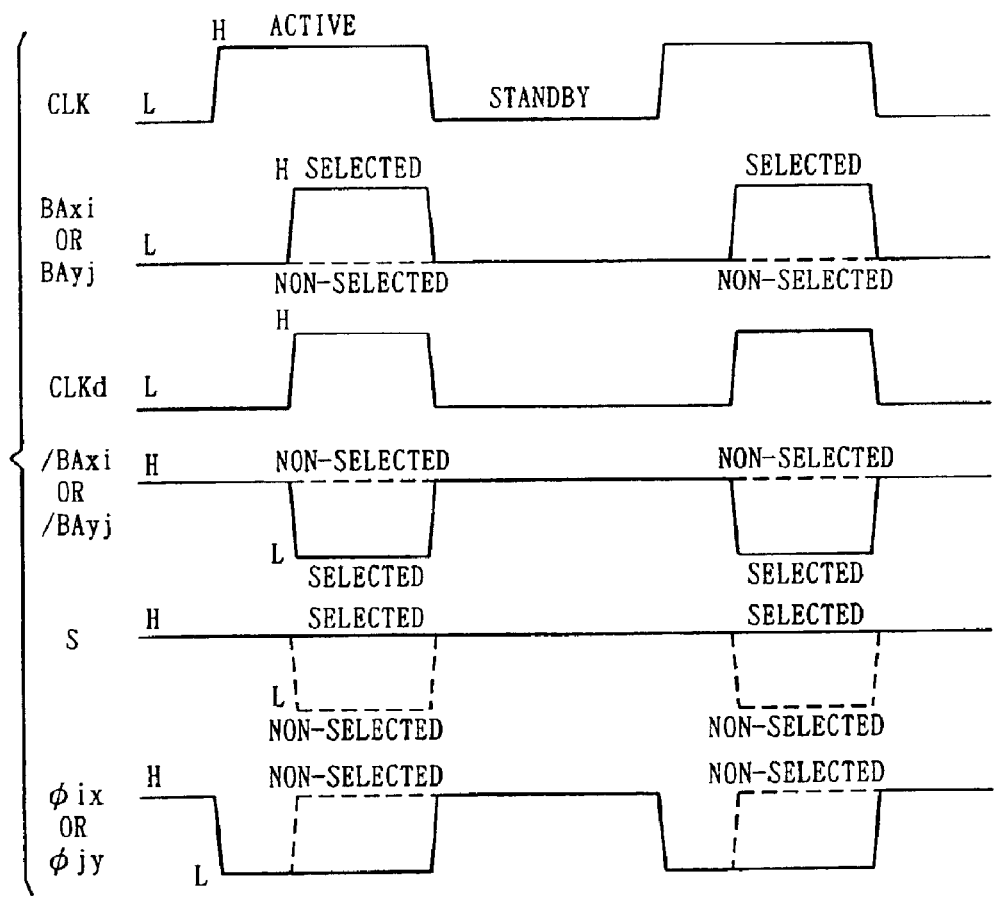
FIG. 33 is a timing chart for describing the operation of the circuit generating φix (i=1–n) and φjy (j=1–k) shown in FIG. 31.

The operation of the circuit generating ϕix (i=1–n) and ϕjy (j=1–k) will be described below with reference to FIG. 33.

When clock signal CLK is at the L level, control signals ϕix (i=1–n) and ϕjy (j=1–k) are all at the H level and the DRAM is in the standby state.

When clock signal CLK rises from the L level to the H level, control signals ϕix (i=1–n) and ϕjy (j=1–k) all attains the L level and the DRAM is in the standby state.

Thereafter, when output signal CLKd from inverter 308 rises from the L level to the H level, block selecting address signals BApx and BAqy corresponding to a block BKpq to be selected for activation by block selecting circuit 290 simultaneously rise to the H level. As a result, control signals ϕpx and ϕqy remain to be at the L level Since block selecting address signals BAij corresponding to blocks BKij other than block BKpq remain to be at the L level, control signals ϕix and ϕjy other than ϕpx and ϕqy change from the L level to the H level.

When clock signal CLK falls from the H level to the L level, all block selecting address signals BAij and output signal CLKd from inverter 308 attain the L level. Thus, all control signals ϕix and ϕjy attain the H level.

The operation of the thus structured DRAM will be described below with respect to the case in which block BKpq is activated.

In the standby state, control signals ϕix (i=1–n) and ϕjy (j=1–k) generated from control signal generating circuit 17 are all at the H level and therefore block selecting transistors PSWix (i=1–n), PSWij (i=1–n, j–k) are off.

In a transition from the standby state to the active state, all block selecting transistors PSWix (i=1–n) PSWij (i=1–n, j=1–k) are turned on. As a result, all sub power supply lines subVcci (i=1–n) are connected to the main power supply line and charged to power supply potential Vcc.

Then, block address signals BApx and BAqy corresponding to block BKpq to be activated by block selecting circuit 290 rise to the H level, and control signals ϕix and ϕjy other than control signals ϕpx and ϕqy change from the L level to the H level. At this time, block selecting transistors PSWpx and PSWpq remain to be at the on state. Since the transition from the standby state to the active state till block address signals BApx and BAqy rise to the H level, sub power supply line subVccp has sufficiently be charged to power supply potential Vcc. It reduces the loss of access time from selection of block BKpq to start of operation of a word line driver. This also decreases a subthreshold current flowing through word drivers WDij included in blocks BKij that are not selected by block selecting circuit 290.

According to the eleventh embodiment, the same effect as the tenth embodiment can also be achieved in the DRAM that is two-dimensionally divided into blocks.

Twelfth Embodiment

In the circuit structures shown in the tenth and eleventh embodiments, each one of a plurality of block selecting transistors including a block selecting transistor corresponding to a block to be activated is once turned on in a transition from the standby state to the active state. It causes problems in such ways that the load of control signals driving the block selecting transistors increases, driving speed is lowered, a large peak current is caused at this time, and generation of a one-shot signal becomes difficult. The twelfth embodiment aims to solve these problems.

Figure 34:
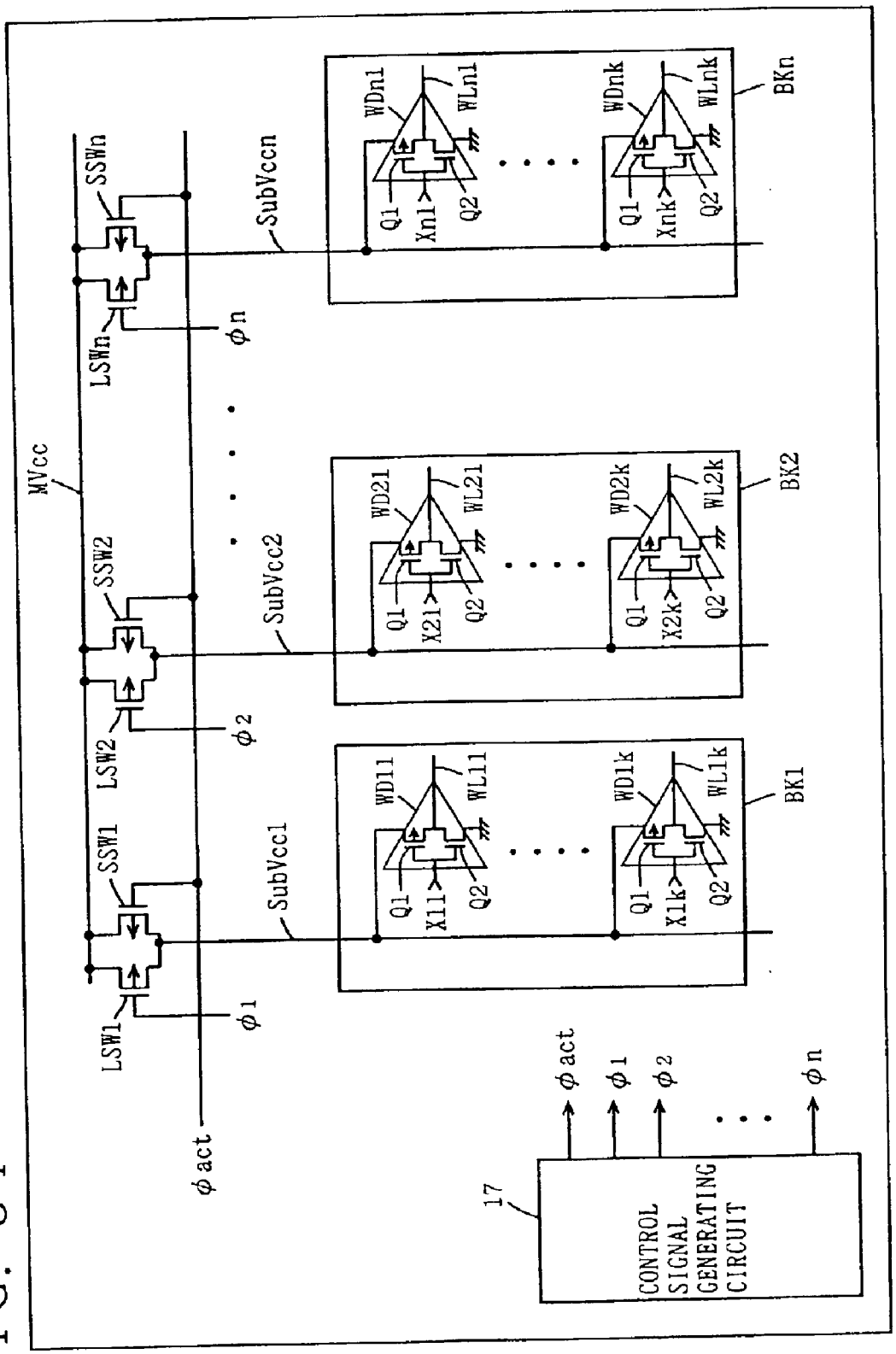
FIG. 34 is a block diagram showing the structure of a block-divided DRAM according to a twelfth embodiment of the present invention.

FIG. 34 is a block diagram showing the structure of a block-divided DRAM according to a twelfth embodiment of the present invention. The block-divided DRAM includes main power supply line MVcc, blocks BKi (i=1–n), control signal generating circuit 17, and block selecting transistors LSWi, SSWi (i=1–n). Blocks BKi (i=1–n) each include a sub power supply line subVcci and word drivers WDi1–WDik connected to sub power supply line subVcci. Control signal generating circuit 17 generates an inverted signal of clock signal CLK as a control signal ϕact and also generates inverted signals of block selecting address signals BAi (i=1–n) as control signals ϕi (i=1–n). Block selection transistors LSWi (i=1–n) have larger drivability than block selecting transistors SSWi (i=1–n), and they are connected between main power supply line MVcc and sub power supply lines subVcci and turned on/off in response to control signals ϕi. Block selecting transistors SSWi (i=1–n) are connected in parallel with block selecting transistors LSWi between main power supply line MVcc and sub power supply lines subVcci and turned on/off in response to control signal ϕact.

Figure 35:
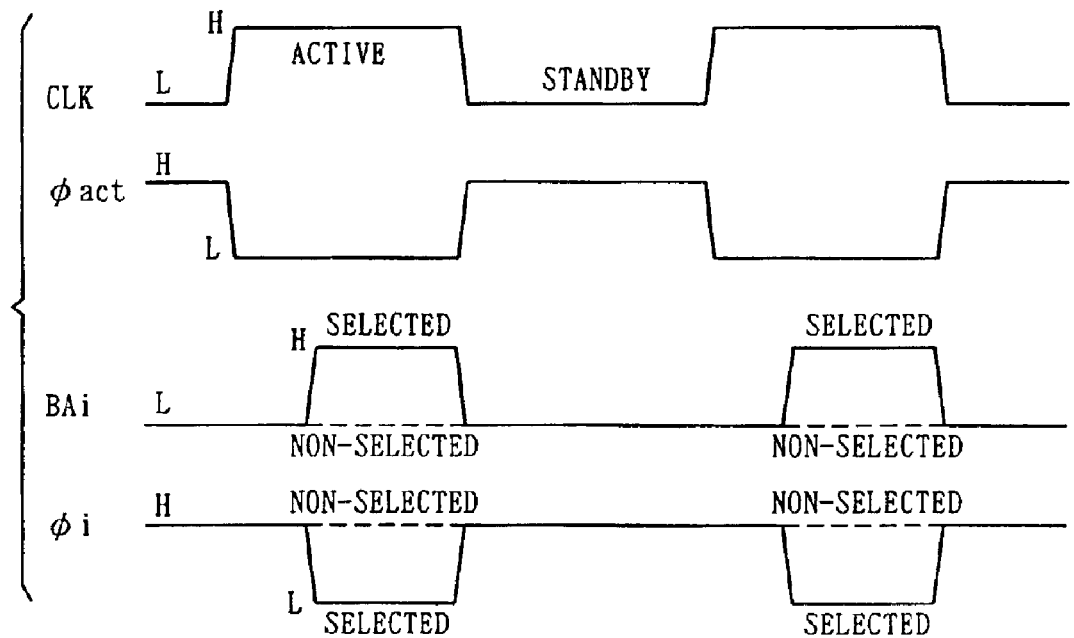
FIG. 35 is a timing chart for describing the operation of the block-divided DRAM shown in FIG. 34.

The operation of the thus structured block-divided DRAM will be described below with reference to FIG. 35.

When clock signal CLK is at the L level, the block-divided DRAM is in the standby state, block selecting address signals BAi (i=1–n) are at the L level, and control signals ϕact and ϕi (i=1–n) are at the H level. Thus, block selecting transistors LSWi, SSWi (i=1–n) are off. As a result, a suhbthreshold current flowing through write drivers WDi1–WDik (i=1–n) included in each block BKi (i=1–n) is decreased.

When clock signal CLK rises from the L level to the H level, the block-divided DRAM changes from the standby state to the active state and control signal ϕact attains the L level. As a result, block selecting transistors SSWi (i=1–n) are turned on and sub power supply lines sub Vcci (i=1–n) are precharged.

Thereafter, block selecting address signal BAj corresponding to block BKj to be selected for activation by block selecting circuit 290 rises to the H level, and control signal ϕj accordingly falls to the L level. As a result, block selecting transistor LSWj is turned on.

When clock signal CLK falls from the H level to the L level, control signals ϕact and ϕj change from the L level to the H level and block selecting transistors LSWi, SSWi (i=1–n) are turned off.

According to the twelfth embodiment, block selecting transistors LSWi, SSWi having different drivability are provided and, in the active state, block selecting transistors SSWi (i=1–n) having smaller drivability are turned on to precharge sub power supply lines subVcci (i=1–n). Thus, the load of control signal ϕact is light and the driving speed will not be lowered. Further, large peak current consumption is not caused at this time. Since control signal ϕact does not require a pulse width so small, it can be generated easily.

Although all block selecting transistors SSWi (i=1–n) are turned on when clock signal CLK rises from the L level to the H level in this embodiment, only m (m<n) block selecting transistors SSWi including block selecting transistor SSWj corresponding to block BKj to be selected may be turned on when clock signal CLK rises from the L level to the H level. The same effect can also be achieved in this case.

Although block selecting transistors LSWi, SSWi having different drivability are used in this embodiment, block selecting transistors having different thresholds may be used instead.

Thirteenth Embodiment

In the block-divided DRAM as shown in the tenth embodiment, sub power supply lines in all blocks need to be once precharged when a power supply is turned on. This is because time loss, and, in an extreme case, a malfunction due to a clock mismatch, for example, are caused in accessing a block connected to a sub power supply line that is not sufficiently precharged at the time of access start. In order to address this problem, block selecting switches corresponding to all blocks are turned on by a power-on pulse to precharge sub power supply lines as shown in the seventh embodiment. However, this causes a large peak current. The thirteenth embodiment aims to solve this problem.

Figure 36:
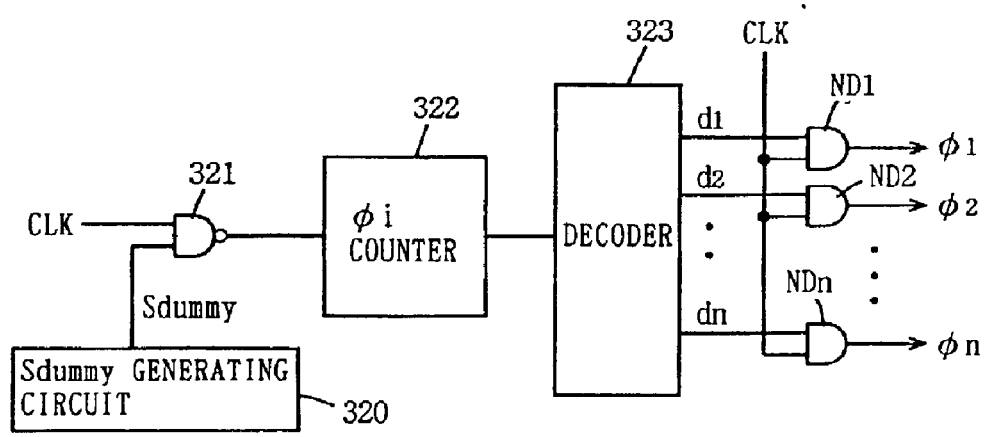
FIG. 36 is a block diagram showing the structure of a control signal generating circuit according to a thirteenth embodiment of the present invention.

A block-divided DRAM according to the thirteenth embodiment of the present invention has a similar structure to the one shown in FIG. 27 and includes a control signal generating circuit shown in FIG. 36 instead of control signal generating circuit 17 shown in FIG. 28.

FIG. 36 is a block diagram showing the structure of the control signal generating circuit according to the thirteenth embodiment of the present invention. Referring to FIG. 36, the control signal generating circuit includes an Sdummy generating circuit 320, an NAND circuit 321, a ϕ1 counter 322, a decoder 323 and NAND circuits NDi (i=1–n). Sdummy generating circuit 320 outputs an H level signal Sdummy during a prescribed dummy cycle after a power supply is turned on. NAND circuit 321 receives clock signal CLK and output signal Sdummy from Sdummy generating circuit 320. Then, ϕi counter 322 counts the number of pulses of clock signal CLK during the dummy cycle. Decoder 323 outputs signals di (i=1–n) according to the count of ϕi counter 322. NAND circuits NDi receive signals di from corresponding decoder 323 and clock signal CLK and output control signals ϕi.

Figure 37:
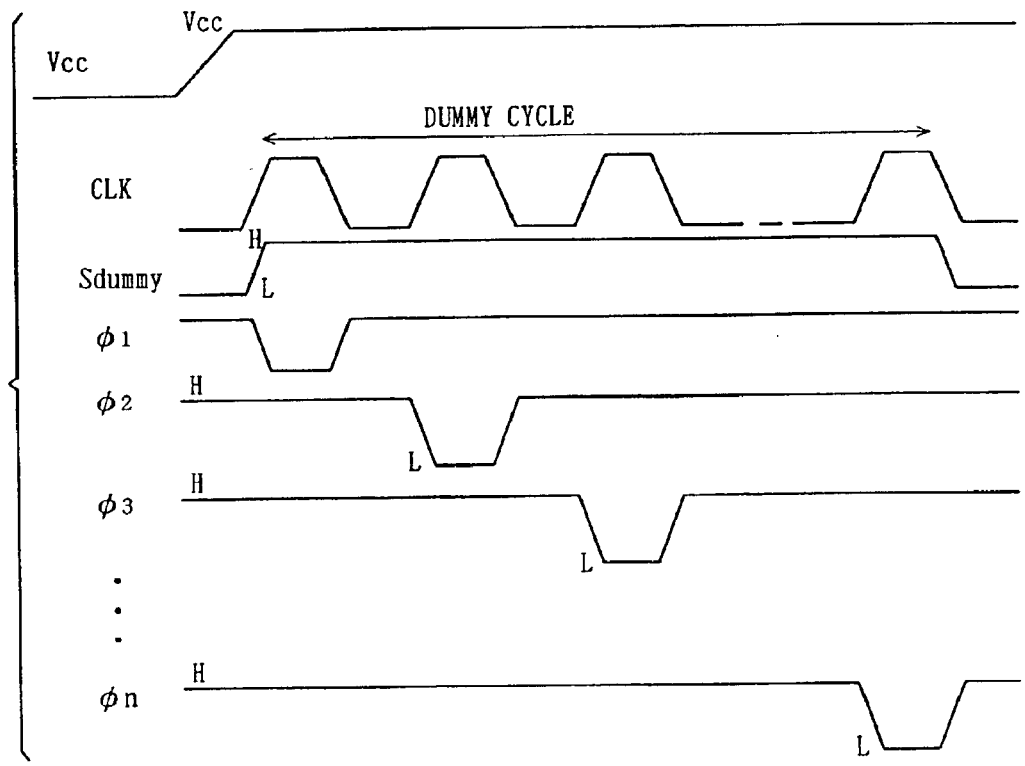
FIG. 37 is a timing chart for describing the operation of a block-divided DRAM according to the thirteenth embodiment of the present invention.

The operation of the thus structured control signal generating circuit will be described below with reference to FIG. 37.

After power supply voltage Vcc rises, an internal circuit in the DRAM is made inoperable while several cycles of clock signal CLK are applied. Here, the period is called a dummy cycle and the number of cycles is n cycles.

After a power supply is turned on and the clock signal rises for the first time (in the first cycle), output signal Sdummy from Sdummy generating circuit 320 rises from the L level to the H level. Thereafter, output signal Sdummy remains to be at the H level until clock signal CLK in the nth cycle falls. As a result, NAND circuit 321 outputs an H level signal. In response, ϕi counter 322 increments the value of the counter c (c=1) and outputs the value to decoder 323. Decoder 323 receives the value c of the counter and outputs only signal dc (d1 in this case) as the H level. As a result, NAND circuit ND1 outputs L level control signal ϕ1 while NAND circuits ND2–NDn output H level control signals ϕ2–ϕn.

Similarly, control signals ϕi (i=1–n) in which only ϕk is at the L level in synchronization with the pulse of clock signal CLK in the kth cycle are output.

The operation of the thus structured block-divided DRAM will be described below with reference to FIG. 37. After a power supply is turned on, clock signal CLK in the first cycle rises and then L level control signal ϕ1 is supplied to block selecting transistor PSW1 to turn on block selecting transistor PSW1. Block selecting transistors PSW2–PSWn are off because they are supplied with H level control signals ϕ2–ϕn. As a result, sub power supply line subVcc1 is precharged. Similarly, sub power supply line subVcck is precharged when the clock signal in the kth cycle rises. In this manner, sub power supply lines subVcci in blocks BKi are successively precharged in each cycle of the dummy cycle.

According to the thirteenth embodiment, a sub power supply line in a corresponding block is precharged in each cycle of the dummy cycle period after a power supply is turned on. Thus, the load of control signals ϕi becomes lighter. Therefore, sub power supply lines in all blocks are precharged till the end of the dummy cycle without causing a large big consumption current.

The number of blocks BK is equal to the number of cycles in the dummy cycle in this embodiment. However, a plurality of blocks may be selected in one cycle when the number of cycles is smaller than the number of blocks, and some blocks may be selected a plurality of times during the dummy cycle period when the number of cycles is larger than the number of blocks.

Fourteenth Embodiment

Figure 38:
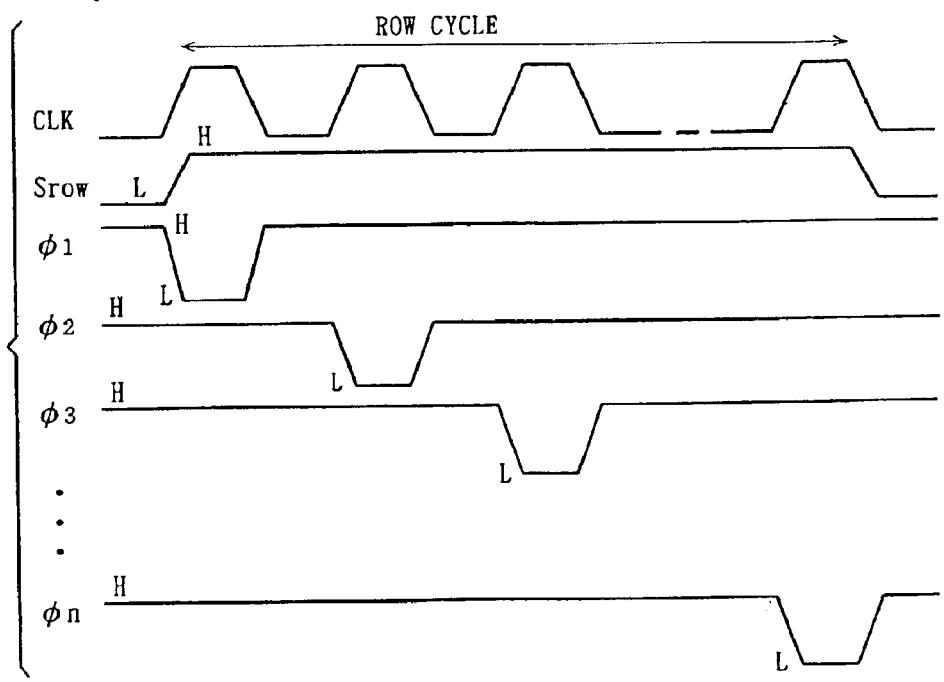
FIG. 38 is a timing chart for describing the operation of a block-divided DRAM according to a fourteenth embodiment of the present invention.

A block-divided DRAM according to a fourteenth embodiment includes an Srow generating circuit (not shown) in place of Sdummy generating circuit 320 shown in FIG. 36. As shown in FIG. 38, the Srow generating circuit generates an output signal Srow that is at the H level in a row cycle after the end of operation of DRAM row address-related circuits till the start of operation of column address-related circuits.

In the thus structured block-divided DRAM, similarly to the thirteenth embodiment, control signals ϕi (I=1–n) in which only ϕk is at the L level in synchronization with the pulse of clock signal CLK in the kth cycle during the row cycle are output and sub power supply line subVcck is precharged. In this manner, sub power supply lines subVcci in blocks BKi are successively precharged in each cycle of the row cycle, and sub power supply lines in all blocks are precharged till the end of the row cycle.

Fifteenth Embodiment

Figure 39:
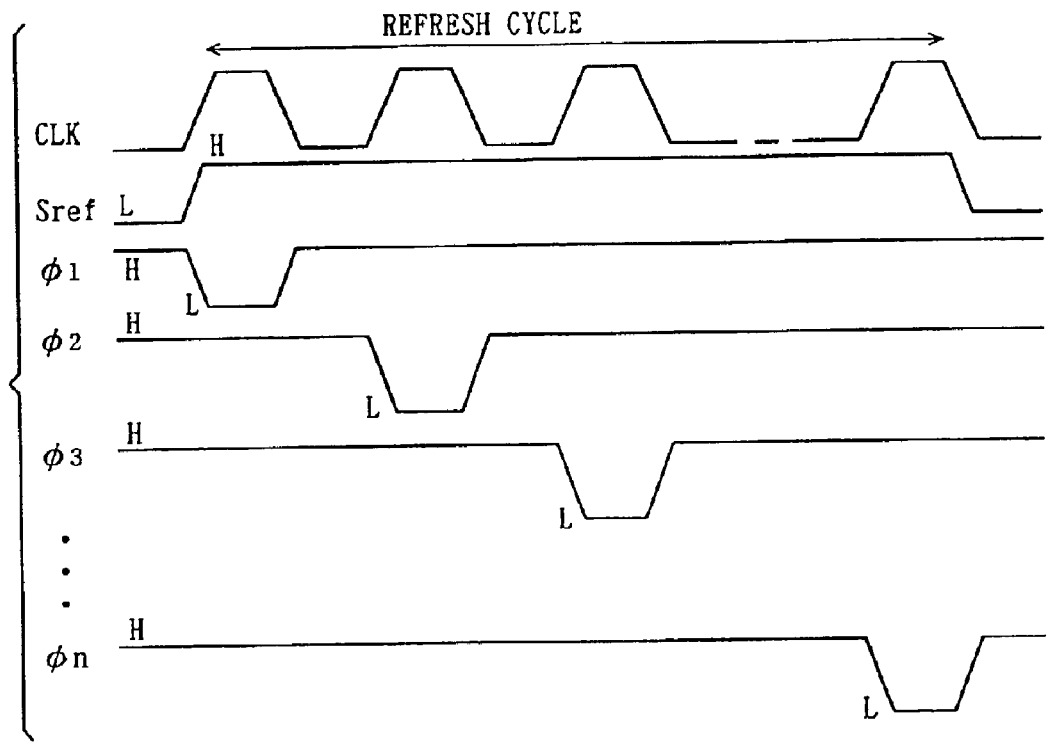
FIG. 39 is a timing chart for describing the operation of a block-divided DRAM according to a fifteenth embodiment of the present invention.
Figure 40:
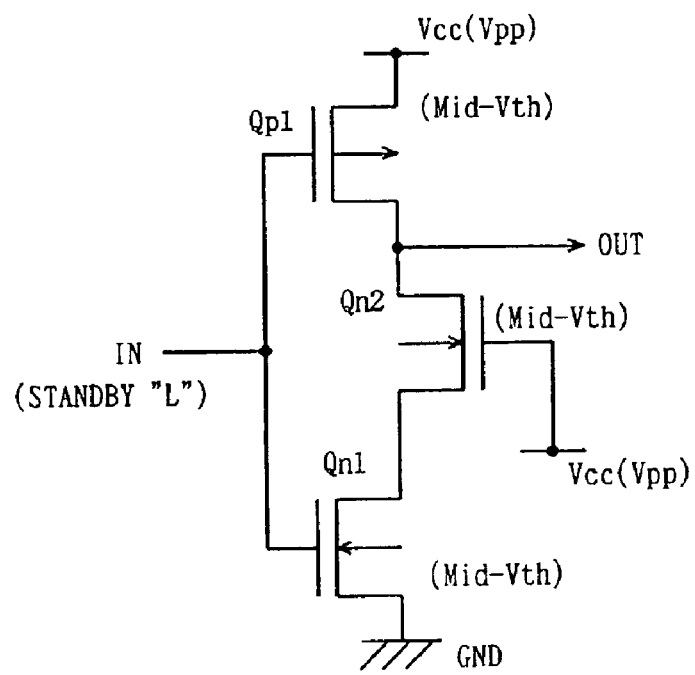
FIG. 40 is a circuit diagram showing one example of NOEMI.
Figure 41:
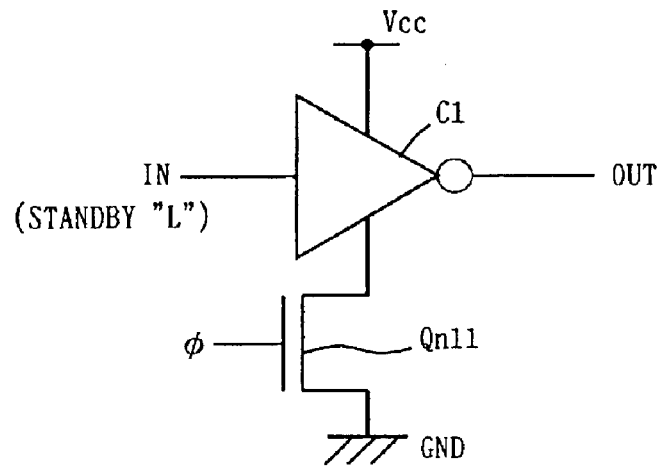
FIG. 41 is a circuit diagram showing one example of the structure of a conventional subthreshold current decreasing circuit.
Figure 42:
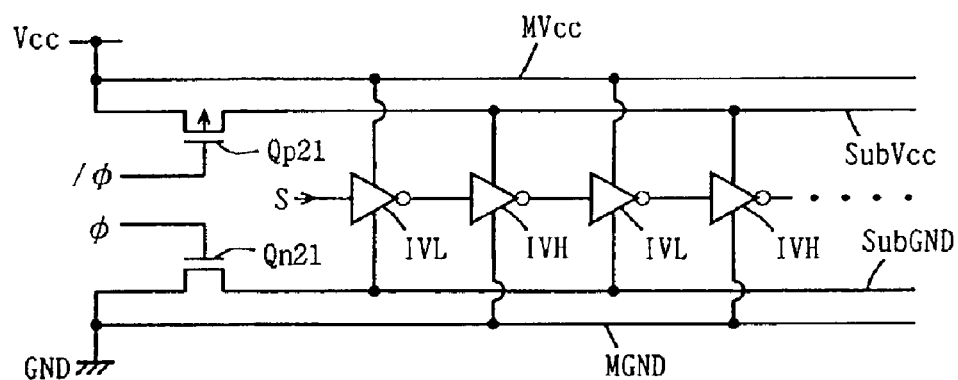
FIG. 42 is a block diagram showing the structure of a conventional logic circuit having a hierarchical power supply structure.
Figure 43:
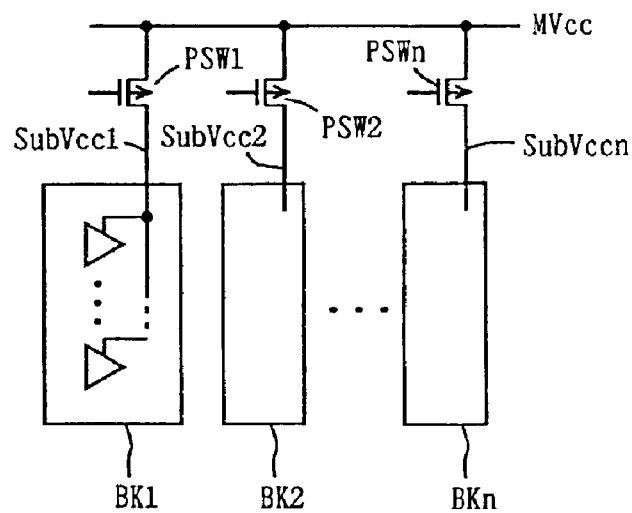
FIG. 43 is a block diagram showing the structure of conventional block-divided logic circuits.

A block-divided DRAM according to a fifteenth embodiment includes an Sref generating circuit (not shown) in place of Sdummy generating circuit 320 shown in FIG. 36. As shown in FIG. 39, the Sref generating circuit generates an output signal Sref that is at the H level during the refresh cycle of the DRAM.

In the thus structured block-divided DRAM, similarly to the thirteenth embodiment, control signals ϕi (i=1–n) in which only φk is at the L level in synchronization with the pulse of clock signal CLK in the kth cycle during the refresh cycle are output, and sub power supply line subVcck is precharged. In this manner, sub power supply lines subVcci in blocks BKi are successively precharged in each cycle of the refresh cycle, and sub power supply lines in all blocks are precharged till the end of the refresh cycle.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor circuit device having active and standby states, comprising:

a main power supply line;

a sub power supply line;

a first switching element, connected between said main power supply line and said sub power supply line, turned on when a power supply is initially turned on, turned on in said active state, and turned off in said standby state;

a main ground line;

a sub ground line;

a second switching element, connected between said main ground line and said sub ground line, turned on when a power supply is initially turned on, turned on in said active state, and turned off in said standby state;

a plurality of first logic circuits each having a power supply node connected to said main power supply line and a ground node connected to said sub ground line for outputting a logic high level signal in said standby state; and a plurality of second logic circuits each having a power supply node connected to said sub power supply line and a ground node connected to said main ground line for outputting a logic low level signal in said standby state.

2. The semiconductor circuit device according to claim 1, wherein said first switching element is a P channel MOS transistor and said second switching element is an N channel MOS transistor.

3. The semiconductor circuit device according to claim 9, wherein said first logic circuits each include an output node, an N channel MOS transistor connected between said output node and said sub ground line, turned on/off in response to an input signal in said active state and turned off in said standby state, and a P channel MOS transistor connected between said output node and said main power supply line, turned on/off in response to an input signal in said active state and turned on in said standby state, and said second logic circuits each include an output node an N channel MOS transistor connected between said output node and said main ground line, turned on/off in response to an input signal in said active state and turned on in said standby state, and a P channel MOS transistor connected between said output node and said sub power supply line, turned on/off in response to an input signal in said active state and turned off in said standby state.

4. The semiconductor circuit device according to claim 3, wherein said first switching element is a P channel MOS transistor and said second switching element is an N channel MOS transistor.

5. The semiconductor circuit device according to claim 1, wherein said first switching element and said second switching element are turned on when the corresponding power supplies are turned on, respectively, for a predetermined time period.

* * * * *